(12) United States Patent
Chu et al.

(10) Patent No.: US 12,431,452 B2
(45) Date of Patent: Sep. 30, 2025

(54) SEMICONDUCTOR PACKAGE INCLUDING CORNER BUMPS COAXIALLY OFFSET FROM THE PADS AND NON-CORNER BUMPS COAXIALLY ALIGNED WITH THE PADS

(71) Applicant: Taiwan Semiconductor Manufacturing Company, Ltd., Hsinchu (TW)

(72) Inventors: Chiang-Jui Chu, Yilan County (TW); Ching-Wen Hsiao, Hsinchu (TW); Hao-Chun Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1052 days.

(21) Appl. No.: 17/461,963

(22) Filed: Aug. 30, 2021

(65) Prior Publication Data
US 2023/0065429 A1    Mar. 2, 2023

(51) Int. Cl.
*H01L 23/00*    (2006.01)

(52) U.S. Cl.
CPC .............. *H01L 24/17* (2013.01); *H01L 24/02* (2013.01); *H01L 24/03* (2013.01); *H01L 24/05* (2013.01);
(Continued)

(58) Field of Classification Search
CPC ..................... H01L 24/02; H01L 24/17; H01L 2224/02206; H01L 2224/0221;
(Continued)

(56) References Cited

U.S. PATENT DOCUMENTS

| 8,993,380 B2 | 3/2015 | Hou et al. |
| 9,281,254 B2 | 3/2016 | Yu et al. |

(Continued)

FOREIGN PATENT DOCUMENTS

| TW | 201318128 | 5/2013 |
| TW | 202109807 | 3/2021 |

OTHER PUBLICATIONS

"Office Action of Taiwan Counterpart Application", issued on May 25, 2023, p. 1-p. 6.

*Primary Examiner* — Marcos D. Pizarro
(74) *Attorney, Agent, or Firm* — JCIPRNET

(57) ABSTRACT

An integrated circuit has corner regions and non-corner regions between the corner regions and includes a semiconductor substrate, conductive pads, passivation layer, post-passivation layer, first conductive posts, and second conductive posts. The conductive pads are disposed over the semiconductor substrate. The passivation layer and the post-passivation layer are sequentially disposed over the conductive pads. The first conductive posts and the second conductive posts are disposed on the post-passivation layer and are electrically connected to the conductive pads. The first conductive posts are disposed in the corner regions and the second conductive posts are disposed in the non-corner regions. Each of the first conductive posts has a body portion and a protruding portion connected to the body portion. A central axis of the body portion of the first conductive post has an offset from a central axis of the protruding portion of the first conductive post.

20 Claims, 18 Drawing Sheets

(52) U.S. Cl.
CPC .............. *H01L 24/11* (2013.01); *H01L 24/13* (2013.01); *H01L 2224/02206* (2013.01); *H01L 2224/0221* (2013.01); *H01L 2224/03011* (2013.01); *H01L 2224/03013* (2013.01); *H01L 2224/03015* (2013.01); *H01L 2224/03019* (2013.01); *H01L 2224/0401* (2013.01); *H01L 2224/13014* (2013.01); *H01L 2224/13018* (2013.01); *H01L 2224/16014* (2013.01); *H01L 2224/16227* (2013.01); *H01L 2224/17104* (2013.01); *H01L 2224/1713* (2013.01); *H01L 2224/17132* (2013.01); *H01L 2224/17179* (2013.01)

(58) Field of Classification Search
CPC . H01L 2224/03013; H01L 2224/03015; H01L 2224/03019; H01L 2224/0401; H01L 2224/16014; H01L 2224/16227; H01L 2224/17104; H01L 2224/17132; H01L 2224/17179; H01L 2224/1713

See application file for complete search history.

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2013/0093079 A1* | 4/2013 | Tu .......................... H01L 24/13 257/737 |

* cited by examiner

SEMICONDUCTOR PACKAGE INCLUDING CORNER BUMPS COAXIALLY OFFSET FROM THE PADS AND NON-CORNER BUMPS COAXIALLY ALIGNED WITH THE PADS

BACKGROUND

The semiconductor integrated circuit (IC) industry has experienced rapid growth. Over the course of this growth, functional density of the devices has generally increased by the device feature size. This scaling down process generally provides benefits by increasing production efficiency, lower costs, and/or improving performance. Such scaling down has also increased the complexities of processing and manufacturing ICs and, for these advances to be realized similar developments in IC fabrication are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
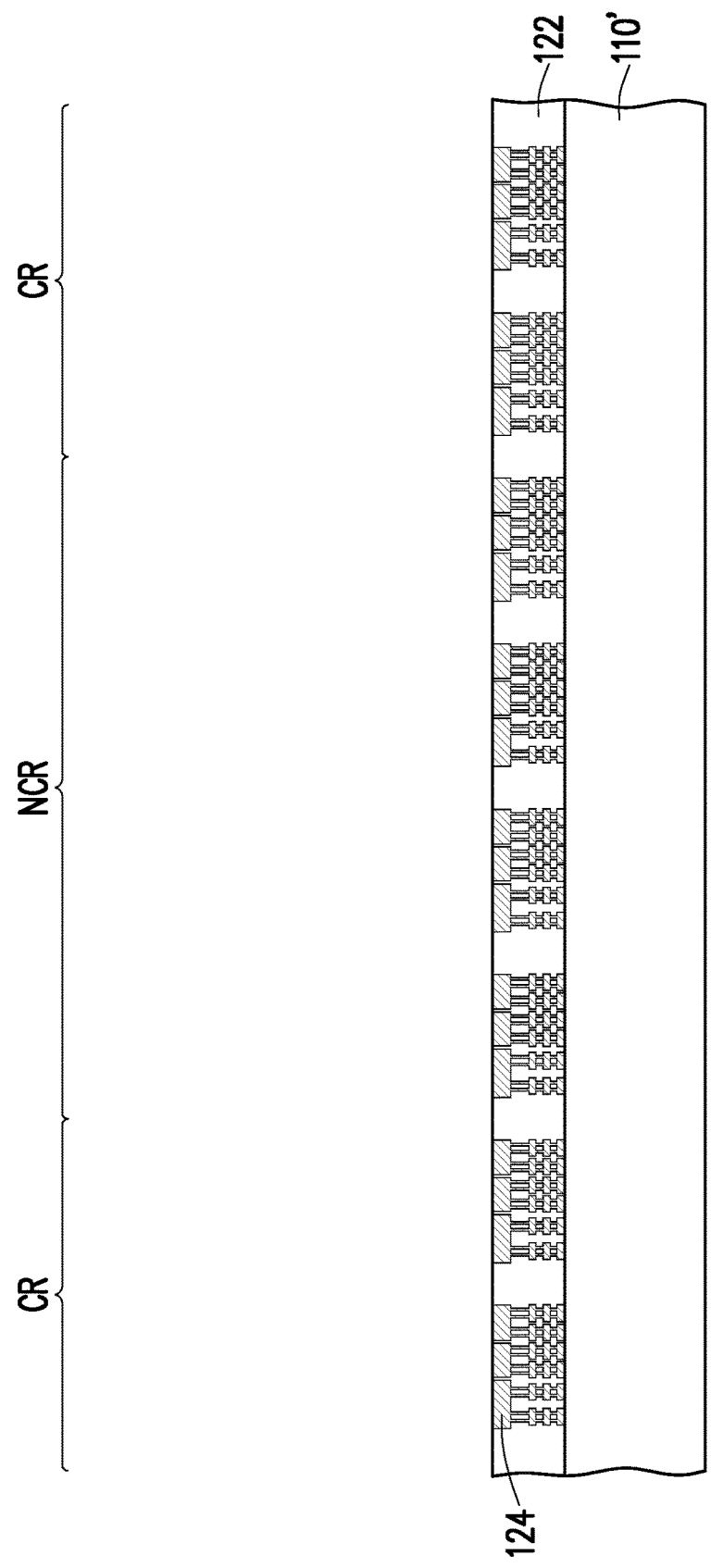
FIG. 1A to FIG. 1J are schematic cross-sectional views illustrating a manufacturing process of an integrated circuit in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Since the openings of the post-passivation layer in the corner regions are shifted toward the center of the integrated circuit, the stress concentrated at the corner regions may be sufficiently reduced. As such, the delamination between the seed layer and the post-passivation layer and between the seed layer and the conductive pads may be sufficiently alleviated, thereby enhancing the reliability and the performance of the integrated circuit.

FIG. 1A to FIG. 1J are schematic cross-sectional views illustrating a manufacturing process of an integrated circuit IC1 in accordance with some embodiments of the disclosure. Referring to FIG. 1A, a semiconductor wafer 110' is provided. In some embodiments, the semiconductor wafer 110' is made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor wafer 110' has active components (e.g., transistors or the like) and passive components (e.g., resistors, capacitors, inductors, or the like) formed therein. In some embodiments, the semiconductor wafer 110' includes a plurality of integrated circuit regions that would be singulated in the subsequent process to form integrated circuits IC1. The integrated circuit regions may arrange in an array from a top view. For simplicity, one integrated circuit region is illustrated in FIG. 1A. As illustrated in FIG. 1A, each integrated circuit region includes a plurality of corner regions CR and a non-corner region NCR between the corner regions CR.

In some embodiments, an interconnection structure 120 is formed on the semiconductor wafer 110'. In some embodiments, the interconnection structure 120 includes an inter-dielectric layer 122 and a plurality of patterned conductive layers 124. For simplicity, the inter-dielectric layer 122 is illustrated as a bulky layer in FIG. 1A, but it should be understood that the inter-dielectric layer 122 may be constituted by multiple dielectric layers. The patterned conductive layers 124 and the dielectric layers of the inter-dielectric layer 122 are stacked alternately. In some embodiments, two adjacent patterned conductive layers 124 are electrically connected to each other through conductive vias sandwiched therebetween.

In some embodiments, a material of the inter-dielectric layer 122 includes polyimide, epoxy resin, acrylic resin, phenol resin, benzocyclobutene (BCB), polybenzoxazole (PBO), or other suitable polymer-based dielectric materials. The inter-dielectric layer 122 may be formed by suitable fabrication techniques, such as spin-on coating, chemical vapor deposition (CVD), plasma-enhanced chemical vapor deposition (PECVD), or the like. In some embodiments, a material of the patterned conductive layers 124 includes aluminum, titanium, copper, nickel, tungsten, and/or alloys thereof. The patterned conductive layers 124 may be formed by electroplating, deposition, and/or photolithography and etching. It should be noted that the number of the patterned conductive layers 124 and the dielectric layers in the inter-dielectric layer 122 shown in FIG. 1A is merely an exemplary illustration, and the disclosure is not limited. In some alternative embodiments, the number of the patterned conductive layers 124 and the dielectric layers in the inter-dielectric layer 122 may be adjusted depending on the routing requirements.

Figure 1B:
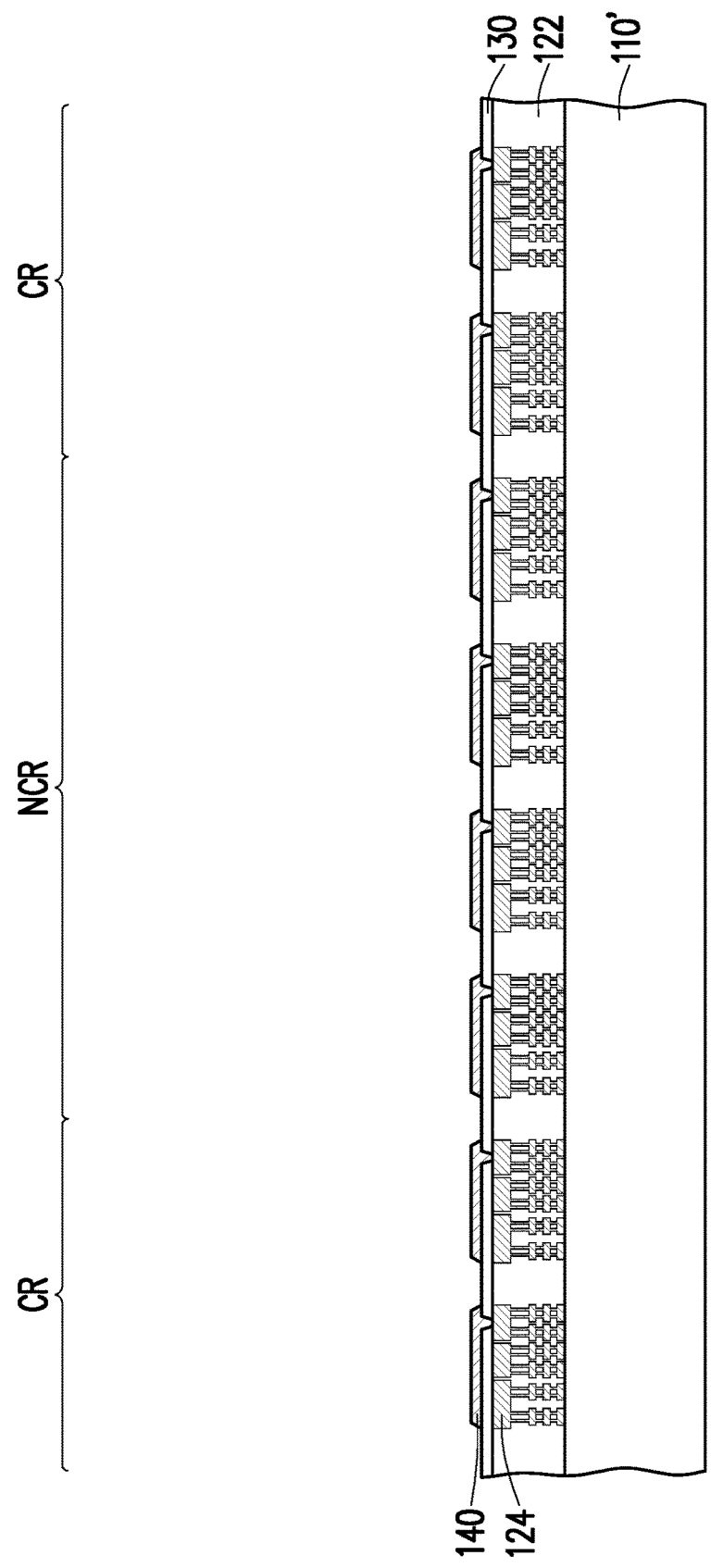

Referring to FIG. 1B, a dielectric layer 130 is formed over the interconnection structure 120. In some embodiments, a material of the dielectric layer 130 includes polyimide, epoxy resin, acrylic resin, phenol resin, BCB, PBO, or any other suitable polymer-based dielectric material. The dielectric layer 130 may be formed by suitable fabrication techniques, such as spin-on coating, CVD, PECVD, or the like. In some embodiments, a plurality of openings is formed in the dielectric layer 130 to expose portions of the topmost patterned conductive layer 124. After the openings are formed, a plurality of conductive pads 140 is formed over the dielectric layer 130. For example, the conductive pads 140 are formed over the semiconductor wafer 110' and the interconnection structure 120 such that the interconnection structure 120 is located between the semiconductor wafer 110' and the conductive pads 140. In some embodiments, the locations of the conductive pads 140 correspond to the locations of the openings of the dielectric layer 130. For example, the conductive pads 140 extend into the openings of the dielectric layer 130 to render electrical connection between the conductive pads 140 and portions of the interconnection structure 120 (i.e. the patterned conductive layer 124). In some embodiments, the conductive pads 140 are aluminum pads, copper pads, or other suitable metal pads. The number and shape of the conductive pads 140 may be selected based on demand.

Figure 1C:
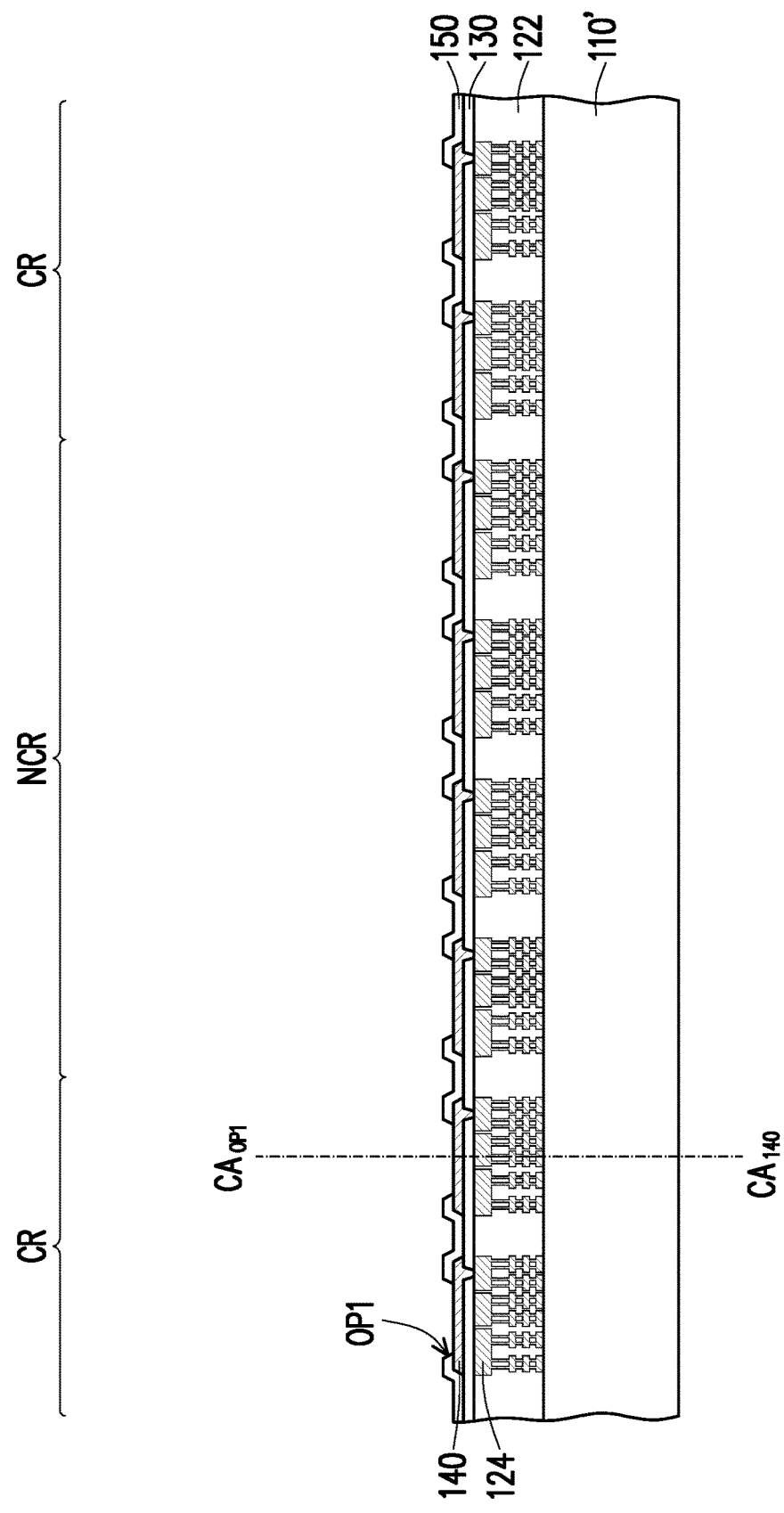

Referring to FIG. 1C, after the conductive pads 140 are distributed over the dielectric layer 130, a passivation layer 150 is formed over the dielectric layer 130 and the conductive pads 140. In some embodiments, the passivation layer 150 is a silicon oxide layer, a silicon nitride layer, a silicon oxy-nitride layer, or a dielectric layer formed by other suitable dielectric materials. As illustrated in FIG. 1C, the passivation layer 150 has a plurality of openings OP1 partially exposing each conductive pad 140. In some embodiments, each opening OP1 is symmetrical with respect to a central axis $CA_{140}$ of the corresponding conductive pad 140. For example, a central axis $CA_{140}$ of each conductive pad 140 is coaxial with a central axis $CA_{OP1}$ of the corresponding opening OP1 of the passivation layer 150. That is, the central axis $CA_{140}$ of each conductive pad 140 is aligned with the central axis $CA_{OP1}$ of the corresponding opening OP1.

Figure 1D:
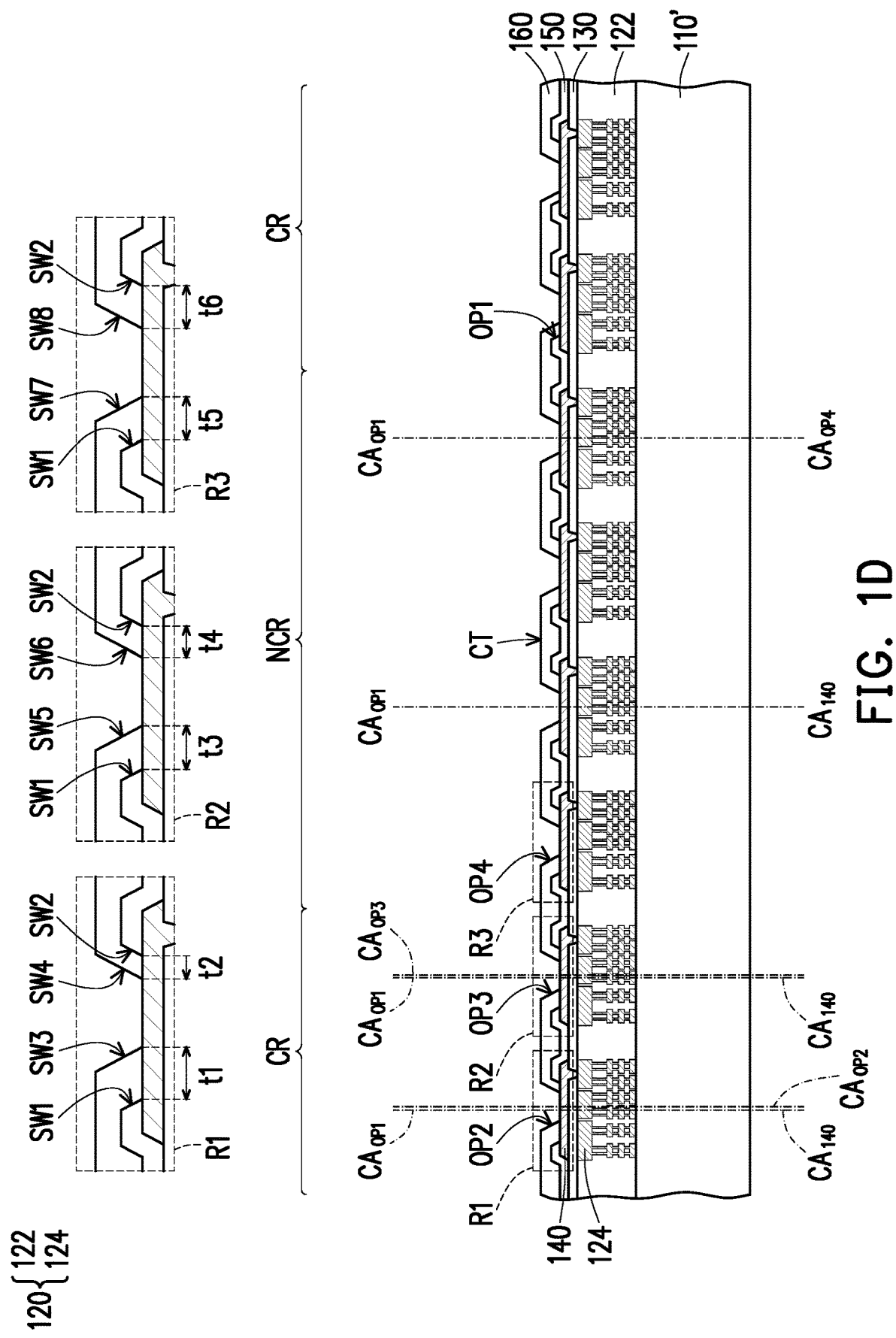

Referring to FIG. 1D, after the passivation layer 150 is formed, a post-passivation layer 160 is formed on the passivation layer 150. In other words, the passivation layer 150 and the post-passivation layer 160 are sequentially disposed over the conductive pads 140. In some embodiments, the post-passivation layer 160 extends into the openings OP1 of the passivation layer 150. In other words, the post-passivation layer 160 is formed within the openings OP1 of the passivation layer 150. In some embodiments, the post-passivation layer 160 is a polyimide layer, a PBO layer, or a dielectric layer formed by other suitable polymers. In some embodiments, the post-passivation layer 160 has a plurality of openings OP2, a plurality of openings OP3, and a plurality of openings OP4. In some embodiments, the openings OP2, the openings OP3, and the openings OP4 of the post-passivation layer 160 are respectively located within the corresponding opening OP1 of the passivation layer 150. In some embodiments, each opening OP2 of the post-passivation layer 160 partially exposes the corresponding conductive pad 140. Similarly, each opening OP3 of the post-passivation layer 160 partially exposes the corresponding conductive pad 140. Meanwhile, each opening OP4 of the post-passivation layer 160 partially exposes the corresponding conductive pad 140. In some embodiments, a size of the openings OP2, a size of the openings OP3, and a size of the openings OP4 are the same. The detailed configuration of the openings OP2, the openings OP3, and the openings OP4 with respect to other elements will be described below in conjunction with FIG. 1D and FIG. 2.

Figure 2:
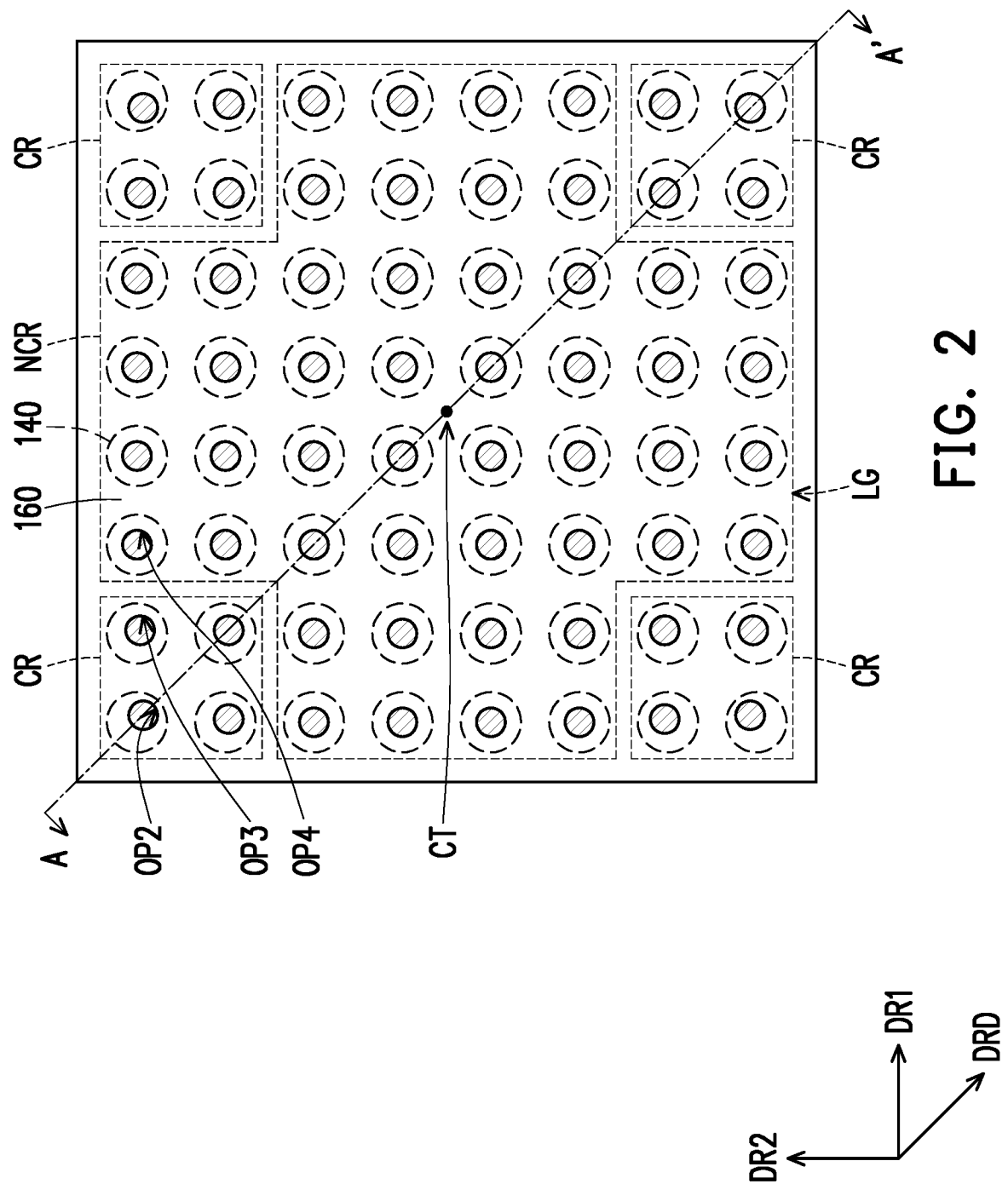
FIG. 2 is a schematic top view of FIG. 1D.

FIG. 2 is a schematic top view of FIG. 1D. It should be noted that in FIG. 2, the cross-sectional view of FIG. 1D is taken along line A-A' extending along a diagonal direction DRD of the structure in FIG. 1D. In some embodiments, two opposite sides of the structure shown in FIG. 1D and FIG. 2 are arranged along a first direction DR1 and another two opposite sides of the structure are arranged along a second direction DR2 perpendicular to the first direction DR1. Meanwhile, the diagonal direction DRD forms an included angle of 45° with both the first direction DR1 and the second direction DR2.

Referring to FIG. 1D and FIG. 2, the openings OP2 and the openings OP3 are located within the corner regions CR while the openings OP4 are located within the non-corner region NCR. In some embodiments, the openings OP4 are closer to a center CT of the subsequently formed integrated circuit IC1 (shown in FIG. 1J) than the openings OP3. Meanwhile, the openings OP3 are closer to the center CT of the subsequently formed integrated circuit IC1 than the openings OP2. As illustrated in FIG. 2, the non-corner region NCR exhibits a cross-shape from the top view. On the other hand, the corner regions CR are adjacent to the non-corner region NCR. For example, the legs of the cross-shape (i.e. the legs LG of the non-corner region NCR) are located between two adjacent corner regions CR. As illustrated in FIG. 2, the corner regions CR are arranged in mirror symmetry with respect to the center CT of the subsequently formed integrated circuit IC1 in some embodiments. Similarly, the openings OP2, the openings OP3, and the opening OP4 are also arranged in mirror symmetry.

As illustrated in FIG. 2, the openings OP4 in the non-corner region NCR are concentric with the corresponding conducive pad 140. Similarly, the openings OP4 in the non-corner region NCR are also concentric with the corresponding opening OP1 of the passivation layer 150. On the other hand, the openings OP2 and the openings OP3 in the corner regions CR are eccentric with the corresponding conductive pad 140. Moreover, the openings OP2 and the openings OP3 in the corner regions CR are also eccentric with the corresponding opening OP1 of the passivation layer 150. For example, as illustrated in FIG. 1D, a central axis $CA_{140}$ of each conductive pad 140 is coaxial with a central axis $CA_{OP1}$ of the corresponding opening OP1 of the passivation layer 150. Meanwhile, the central axis $CA_{OP1}$ of each opening OP1 of the passivation layer 150 is also coaxial with a central axis $CA_{OP4}$ of the corresponding opening OP4 of the post-passivation layer 160. In other words, the central axes $CA_{140}$ of the conductive pads 140, the central axes $CA_{OP1}$ of the openings OP1 of the passivation layer 150, and the central axes $CA_{OP4}$ of the openings OP4 of the post-passivation layer 160 are aligned.

In some embodiments, unlike the openings OP4 in the non-corner region NCR, the openings OP2 and the openings OP3 in the non-corner regions CR have different arrangements. As mentioned above, the central axis $CA_{140}$ of each conductive pad 140 is coaxial with a central axis $CA_{OP1}$ of the corresponding opening OP1 of the passivation layer 150. However, as illustrated in FIG. 1D, a central axis $CA_{140}$ of each conductive pad 140 has an offset from a central axis $CA_{OP2}$ of the corresponding opening OP2 of the post-passivation layer 160 along the diagonal direction DRD. In other words, the central axis $CA_{OP1}$ of each opening OP1 of the passivation layer 150 also has an offset from the central axis $CA_{OP2}$ of the corresponding opening OP2 of the post-passivation layer 160 along the diagonal direction DRD. That is, the central axes $CA_{OP2}$ of the openings OP2 are not aligned with the central axes $CA_{140}$ of the conductive pads 140 and the central axes $CA_{OP1}$ of the openings OP1 of the passivation layer 150. In some embodiments, locations of the openings OP2 are shifted toward the center CT of the subsequently formed integrated circuit IC1 to create the offset. In some embodiments, the offset of the openings OP2 ranges from about 1 µm to about 8 µm along the diagonal direction DRD.

Similarly, the openings OP3 of the post-passivation layer 160 also have an offset along the diagonal direction DRD. As illustrated in FIG. 1D, a central axis $CA_{140}$ of each conductive pad 140 has an offset from a central axis $CA_{OP3}$ of the corresponding opening OP3 of the post-passivation layer 160 along the diagonal direction DRD. In other words, the central axis $CA_{OP1}$ of each opening OP1 of the passivation layer 150 also has an offset from the central axis $CA_{OP3}$ of the corresponding opening OP3 of the post-passivation layer 160 along the diagonal direction DRD. That is, the central axes $CA_{OP3}$ of the openings OP3 are not aligned with the central axes $CA_{140}$ of the conductive pads 140 and the central axes $CA_{OP1}$ of the openings OP1 of the passivation layer 150. In some embodiments, locations of the openings OP3 are shifted toward the center of the subsequently formed integrated circuit IC1 to create the offset. In some embodiments, the offset of the openings OP3 is smaller than the offset of the openings OP2. For example, the offset of the openings OP3 ranges from about 0.9 µm to about 7.9 µm along the diagonal direction DRD.

As mentioned above, the openings OP4 are closer to a center CT of the subsequently formed integrated circuit IC1 than the openings OP3, and the openings OP3 are closer to the center CT of the subsequently formed integrated circuit IC1 than the openings OP2. As such, the closer the openings OP2, OP3, OP4 to the center CT of the integrated circuit IC1 is, the smaller the offset is. In other words, the openings OP2 are shifted more than the openings OP3, and the openings OP3 are shifted more than the openings OP4. For example, since the openings OP4 are the closest to the center CT of the integrated circuit IC1 among the openings OP2, OP3, OP4, the openings OP4 have zero offset.

In some embodiments, since the central axes $CA_{OP1}$ of the openings OP1 of the passivation layer 150 are coaxial with the central axes $CA_{OP4}$ of the corresponding openings OP4 of the post-passivation layer 160, a thickness of portions of the post-passivation layer 160 located within the openings OP1 of the passivation layer 150 and around the openings OP4 is uniform. On the contrary, since the central axes $CA_{OP1}$ the openings OP1 of the passivation layer 150 are not coaxial with the central axes $CA_{OP2}$ of the corresponding openings OP2 and the corresponding openings OP3 of the post-passivation layer 160, a thickness of portions of the post-passivation layer 160 located within the openings OP1 of the passivation layer 150 and around the openings OP2 and the openings OP3 is not uniform. The thickness variation of the post-passivation layer 160 will be described below in conjunction with the enlarged views of regions R1, R2, and R3 in FIG. 1D.

Referring to FIG. 1D, each opening OP1 of the passivation layer 150 has a first sidewall SW1 and a second sidewall SW2 opposite to the first sidewall SW1. Meanwhile, each opening OP2 of the post-passivation layer 160 has a third sidewall SW3 and a fourth sidewall SW4 opposite to the third sidewall SW3. In some embodiments, a first distance between the first sidewall SW1 and the third sidewall SW3 corresponds to a first thickness t1 of the post-passivation layer 160. Meanwhile, a second distance between the second sidewall SW2 and the fourth sidewall SW4 corresponds to a second thickness t2 of the post-passivation layer 160. As illustrated in FIG. 1D, the first thickness t1 is greater than the second thickness t2. For example, the first thickness t1 ranges from about 10 µm to about 18 µm, and the second thickness t2 ranges from about 2 µm to about 10 µm. In other words, the thickness (i.e. the first thickness t1 and the second thickness t2) of the post-passivation layer 160 located within the openings OP1 and around the openings OP2 is not uniform.

Similarly, each opening OP3 of the post-passivation layer 160 has a fifth sidewall SW5 and a sixth sidewall SW6 opposite to the fifth sidewall SW5. In some embodiments, a third distance between the first sidewall SW1 and the fifth sidewall SW5 corresponds to a third thickness t3 of the post-passivation layer 160. Meanwhile, a fourth distance between the second sidewall SW2 and the sixth sidewall SW6 corresponds to a fourth thickness t4 of the post-passivation layer 160. As illustrated in FIG. 1D, the third thickness t3 is greater than the fourth thickness t4. For example, the third thickness t3 ranges from about 9.9 µm to about 17.9 µm, and the fourth thickness t4 ranges from about 2.1 µm to about 10.1 µm. In other words, the thickness (i.e. the third thickness t3 and the fourth thickness t4) of the post-passivation layer 160 located within the openings OP1 and around the openings OP3 is not uniform. As mentioned above, since the openings OP2 are shifted more than the openings OP3, the third thickness t3 is smaller than the first thickness t1. On the other hand, the fourth thickness t4 is greater than the second thickness t2.

Moreover, each opening OP4 of the post-passivation layer 160 has a seventh sidewall SW7 and an eighth sidewall SW8 opposite to the seventh sidewall SW7. In some embodiments, a fifth distance between the first sidewall SW1 and the seventh sidewall SW7 corresponds to a fifth thickness t5 of the post-passivation layer 160. Meanwhile, a sixth distance between the second sidewall SW2 and the eighth sidewall SW8 corresponds to a sixth thickness t6 of the post-passivation layer 160. As illustrated in FIG. 1D, the fifth thickness t5 is substantially equal to the sixth thickness t6. For example, the fifth thickness t5 and the sixth thickness t6 range from about 6 µm to about 14 µm. In other words, the thickness (i.e. the fifth thickness t5 and the sixth thickness t6) of the post-passivation layer 160 located within the openings OP1 and around the openings OP4 is uniform. As mentioned above, since the openings OP4 are not shifted, the fifth thickness t5 is smaller than the first thickness t1 and the third thickness t3, and the sixth thickness t6 is greater than the second thickness t2 and the fourth thickness t4.

Figure 1E:
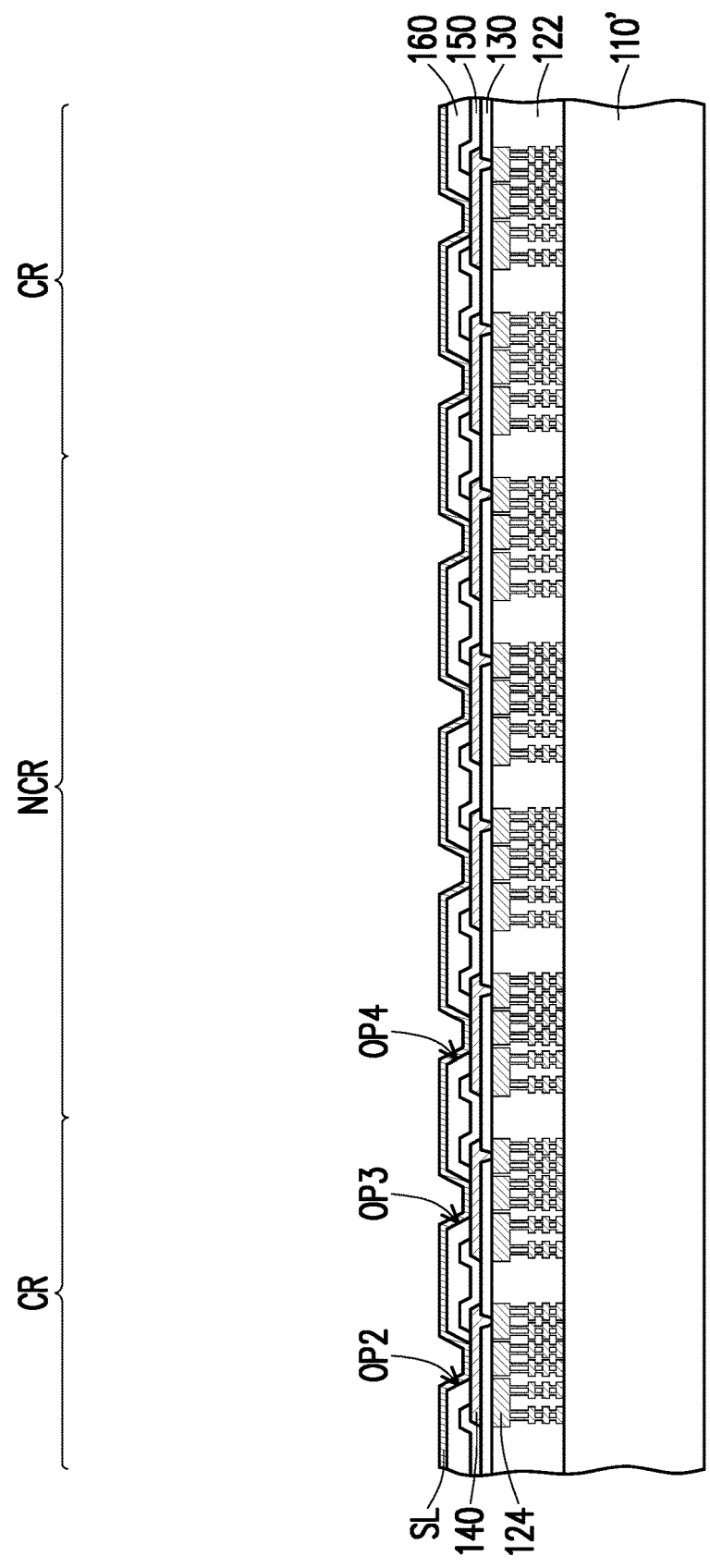

Referring to FIG. 1E, after forming the post-passivation layer 160, a seed layer SL is conformally formed on the post-passivation layer 160. For example, at least a portion of the seed layer SL extends into the openings OP2, the openings OP3, and the openings OP4 to be in physical with the conductive pads 140. The seed layer SL may be formed through a sputtering process, a physical vapor deposition (PVD) process, or the like. In some embodiments, the seed layer SL is constituted by two sub-layers (not shown). The first sub-layer may include titanium, titanium nitride, tantalum, tantalum nitride, other suitable materials, or a combination thereof. On the other hand, the second sub-layer may include copper, copper alloys, or other suitable choice of materials.

Figure 1F:
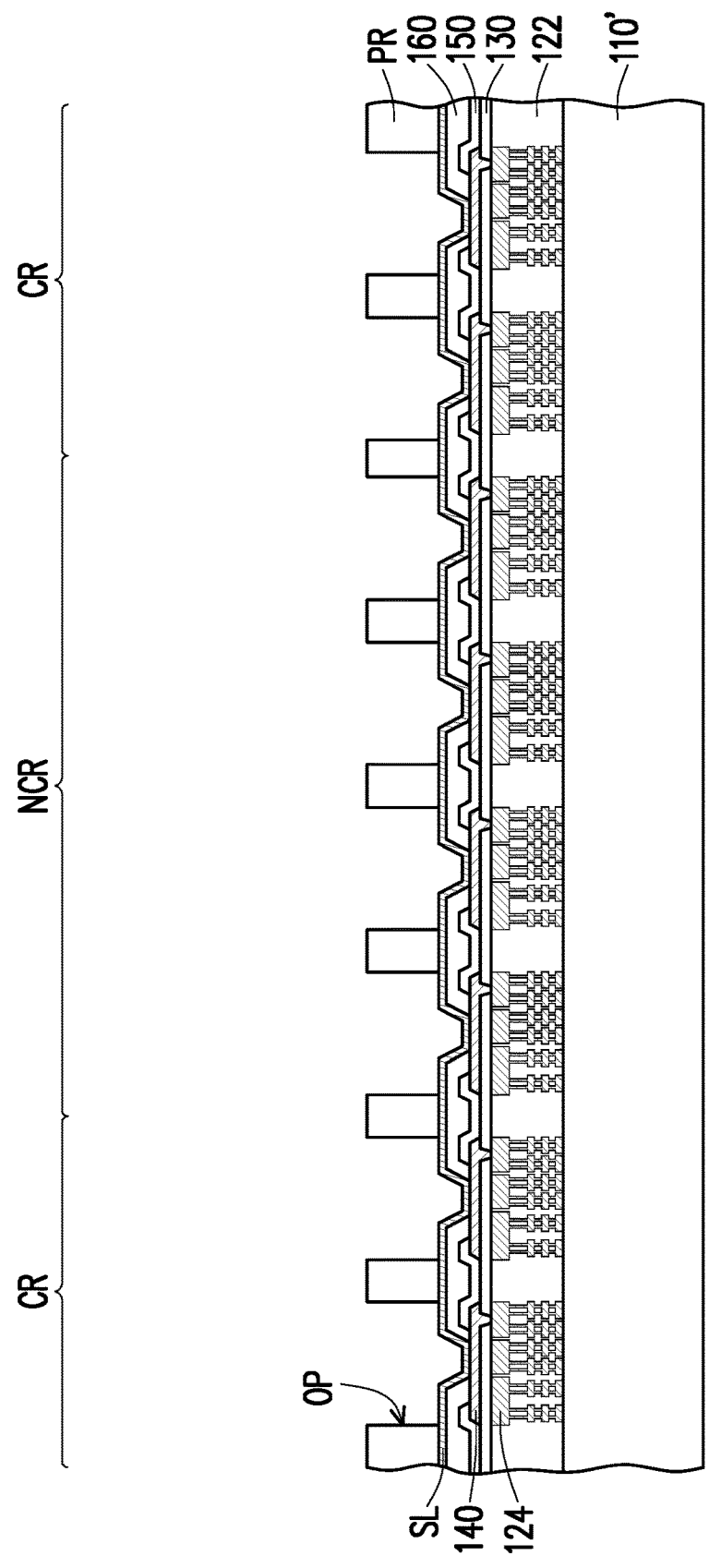

Referring to FIG. 1F, a patterned photoresist layer PR is formed over the seed layer SL. In some embodiments, the patterned photoresist layer PR is made of a photosensitive material. In some embodiments, the patterned photoresist layer PR has a plurality of openings OP partially exposing the seed layer SL above the contact pads 140. For example, the openings OP expose the seed layer SL located directly above the contact pads 140.

Figure 1G:
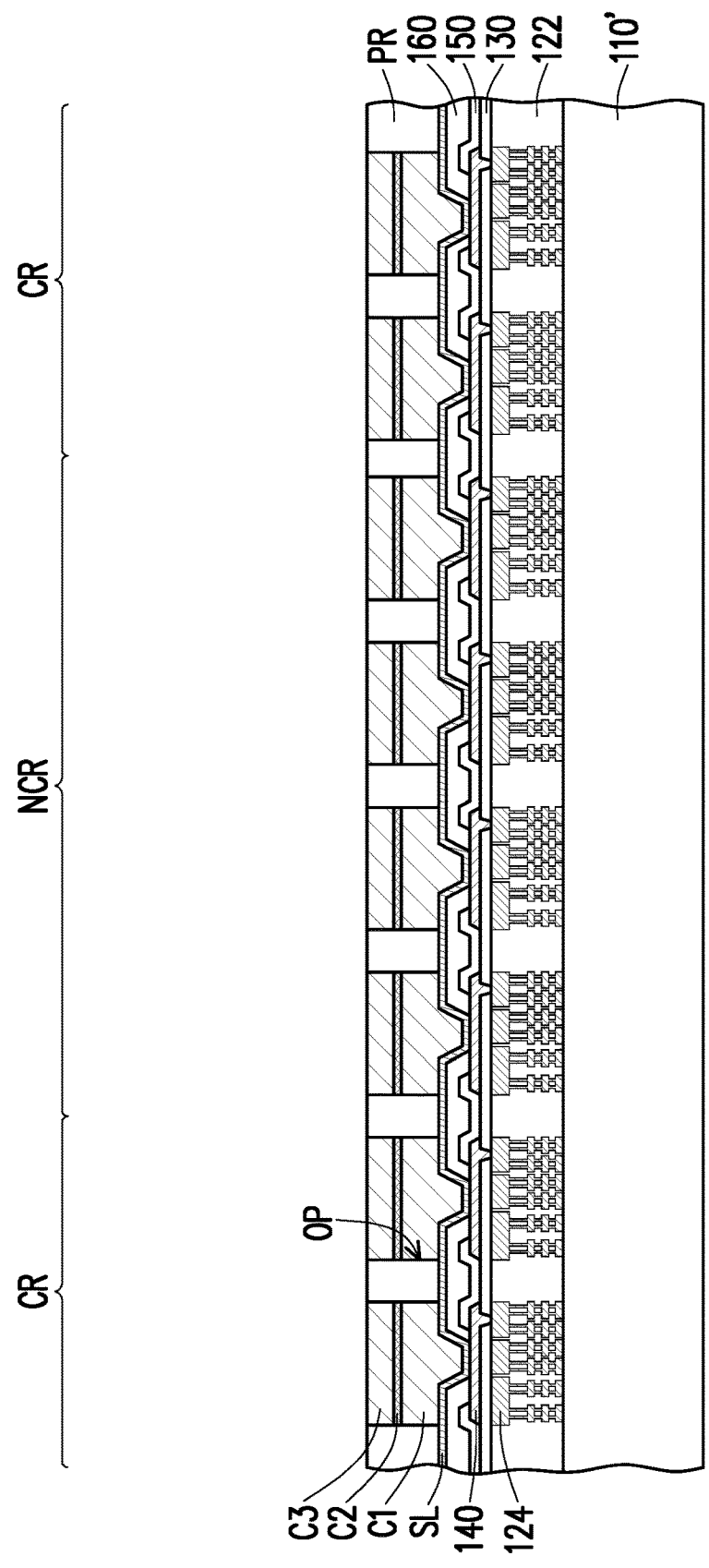

Referring to FIG. 1G, a first conductive layer C1, a second conductive layer C2, and a third conductive layer C3 are sequentially deposited onto the exposed seed layer SL. For example, the first conductive layer C1, the second conductive layer C2, and the third conductive layer C3 are filled into the openings OP of the patterned photoresist layer PR. In some embodiments, the first conductive layer C1, the second conductive layer C2, and the third conductive layer C3 are formed through the same technique. However, the disclosure is not limited thereto. In some alternative embodiments, the first conductive layer C1, the second conductive layer C2, and the third conductive layer C3 may be formed by different techniques. In some embodiments, the conductive layer C1, the second conductive layer C2, and the third conductive layer C3 are formed through a plating process. The plating process is, for example, an electro-plating process, an electroless-plating process, an immersion plating process, or the like. In some embodiments, materials of the first conductive layer C1, the second conductive layer C2, and the third conductive layer C3 are different. For example, the conductive layer C1 is made of aluminum, titanium, copper, tungsten, and/or alloys thereof. On the other hand, the conductive layer C2 is made of nickel. Moreover, the third conductive layer C3 is made of solder. In some embodiments, a thickness of the first conductive layer C1 is greater than a thickness of the second conductive layer C2 and a thickness of the third conductive layer C3. On the other hand, the thickness of third conductive layer C3 is greater than the thickness of the second conductive layer C2.

Figure 1H:
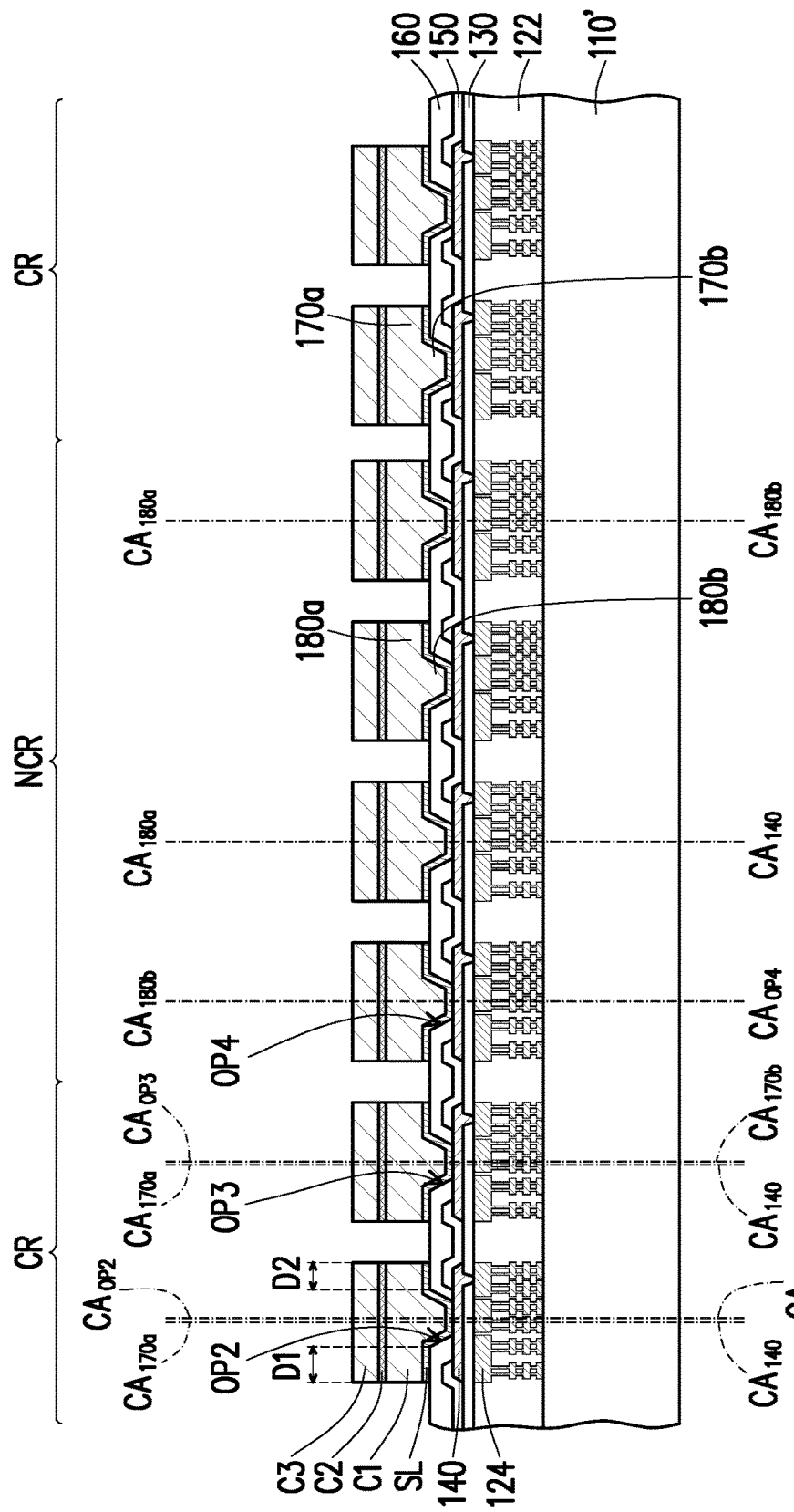

Referring to FIG. 1G and FIG. 1H, the patterned photoresist layer PR is removed. The patterned photoresist layer PR may be removed through an etching process, a stripping process, an ashing process, a combination thereof, or the like. Thereafter, by using the first conductive layer C1, the second conductive layer C2, and the third conductive layer C3 as hard masks, the seed layer SL that is uncovered by the first conductive layer C1, the second conductive layer C2, and the third conductive layer C3 is removed. In some embodiments, portions of the seed layer SL are removed through an etching process. After removal of portions of the seed layer SL, the remaining seed layer SL is located directly underneath the first conductive layer C1. That is, the seed layer SL is sandwiched between the contact pads 140 and the first conductive layer C1. In some embodiments, the remaining seed layer SL, the first conductive layer C1, and the second conductive layer C2 located in the corner regions CR are collectively referred to as first conductive posts 170. On the other hand, the remaining seed layer SL, the first conductive layer C1, and the second conductive layer C2 located in the non-corner region NCR are collectively referred to as second conductive posts 180. In other words, the first conductive posts 170 are disposed in the corner regions CR while the second conductive posts 180 are disposed in the non-corner region NCR. In some embodiments, the first conductive posts 170 and the second conductive posts 180 are disposed on the post-passivation layer 160. In some embodiments, the first conductive posts 170 are located directly above the openings OP2 and the openings OP3 of the post-passivation layer 160. On the other hand, the second conductive posts 180 are located directly above the openings OP4 of the post-passivation layer 160. For example, a portion of each conductive post 170 fills up the corresponding openings OP2 and the corresponding openings OP3 of the post-passivation layer 160. Similarly, a portion of each conductive post 180 fills up the corresponding openings OP4 of the post-passivation layer 160.

In some embodiments, each of the first conductive posts 170 has a body portion 170a and a protruding portion 170b connected to the body portion 170a. As illustrated in FIG. 1H, the protruding portions 170b are located in the openings OP2 and the openings OP3 and the body portions 170a are located above the openings OP2 and the openings OP3. Since the protruding portions 170b completely fill up the openings OP2 and the openings OP3, a shape of the protruding portions 170b is identical to a shape of the openings OP2 and a shape of the openings OP3. For example, the protruding portion 170b, the openings OP2, and the openings OP3 are circular-shaped from a top view. In some embodiments, the first conductive posts 170 are electrically connected to the conductive pads 140. For example, the protruding portions 170b of the first conductive posts 170 are in physical contact with the conductive pads 140 to render electrical connection between the first conductive posts 170 and the conductive pads 140. As mentioned above, since the protruding portions 170b fill up the openings OP2 and the openings OP3, the protruding portions 170b are concentric with the corresponding openings OP2 and the corresponding openings OP3. For example, a central axis $CA_{170b}$ of the protruding portion 170b of the first conductive post 170 is coaxial with the central axis $CA_{OP2}$ of the corresponding opening OP2 of the post-passivation layer 160. Similarly, the central axis $CA_{170b}$ of the protruding portion 170b of the first conductive post 170 is coaxial with the central axis $CA_{OP3}$ of the corresponding opening OP3 of the post-passivation layer 160. That is, the central axes $CA_{170b}$ of the protruding portions 170b of the first conductive posts 170 are aligned with the central axes $CA_{OP2}$ of the corresponding openings OP2 of the post-passivation layer 160 and the central axes $CA_{OP3}$ of the corresponding openings OP3 of the post-passivation layer 160. As illustrated in FIG. 1H, the body portion 170a of the first conductive post 170 is concentric with the corresponding conductive pad 140. For example, a central axis $CA_{170a}$ of the body portion 170a of the first conductive post 170 is coaxial with the central axis $CA_{140}$ of the corresponding conductive pad 140. That is, the central axis $CA_{170a}$ of the body portion 170a of the first conductive post 170 is aligned with the central axis $CA_{140}$ of the corresponding conductive pad 140. As mentioned above, the openings OP2 and the openings OP3 of the post-passivation layer 160 are shifted. Since the protruding portions 170b of the first conductive posts 170 fill up the openings OP2 and the openings OP3, the protruding portions 170b are also shifted. For example, as illustrated in FIG. 1H, the central axis $CA_{170a}$ of the body portion 170a of the first conductive post 170 has an offset from the central axis $CA_{170b}$ of the protruding portion 170b of the same first conductive post 170 along the diagonal direction DRD. That is, the central axes $CA_{170a}$ of the body portions 170a of the first conductive posts 170 are not aligned with the central axes $CA_{170b}$ of the protruding portions 170b of the first conductive posts 170.

As illustrated in FIG. 1H, a distance between a first sidewall of the body portion 170a of the first conductive post 170 and a first sidewall of the protruding portion 170b of the same first conductive post 170 is D1, and a distance between a second sidewall of the body portion 170a of the first conductive post 170 and a second sidewall of the protruding portion 170b of the same first conductive post 170 is D2. In some embodiments, D1 is greater than D1, and $1 < D1/D2 < 3$.

In some embodiments, each of the second conductive posts 180 has a body portion 180a and a protruding portion 180b connected to the body portion 180a. As illustrated in FIG. 1H, the protruding portions 180b are located in the openings OP4 and the body portions 170a are located above the openings OP4. Since the protruding portions 180b completely fill up the openings OP4, a shape of the protruding portions 180b is identical to a shape of the openings OP4. For example, the protruding portion 180b and the openings OP4 are circular-shaped from a top view. In some embodiments, the second conductive posts 180 are electrically connected to the conductive pads 140. For example, the protruding portions 180b of the second conductive posts 180 are in physical contact with the conductive pads 140 to render electrical connection between the second conductive posts 180 and the conductive pads 140. As mentioned above, since the protruding portions 180b fill up the openings OP4, the protruding portions 180b are concentric with the corresponding openings OP4. For example, a central axis $CA_{180b}$ of the protruding portion 180b of the second conductive post 180 is coaxial with the central axis $CA_{OP4}$ of the corresponding opening OP4 of the post-passivation layer 160. That is, the central axes $CA_{180b}$ of the protruding portions 180b of the second conductive posts 180 are aligned with the central axes $CA_{OP4}$ of the openings OP4 of the post-passivation layer 160. As illustrated in FIG. 1H, the body portion 180a of the second conductive post 180 is concentric with the corresponding conductive pad 140. For example, a central axis $CA_{180a}$ of the body portion 180a of the second conductive post 180 is coaxial with the central axis $CA_{140}$ of the corresponding conductive pads 140. That is, the central axes $CA_{180a}$ of the body portions 180a of the second conductive posts 180 are aligned with the central axes $CA_{140}$ of the conductive pads 140. As mentioned above, the openings OP4 of the post-passivation layer 160 are not shifted. Since the protruding portions 180b of the second conductive posts 180 fill up the openings OP4, the protruding portions 180b are also not shifted. For example, as illustrated in FIG. 1H, the central axis $CA_{180a}$ of the body portion 180a of the second conductive post 180 is coaxial with the central axis $CA_{180b}$ of the protruding portion 180b of the same second conductive post 180. That is, the central axes $CA_{180a}$ of the body portions 180a of the second conductive posts 180 are aligned with the central axes $CA_{180b}$ of the protruding portions 180b of the second conductive posts 180.

As mentioned above, sizes of the openings OP2, the openings OP3, and the openings OP4 are the same. Since the protruding portions 170b of the first conductive posts 170 fill into the openings OP2 and the openings OP3 and the protruding portions 180b of the second conductive posts 180 fill into the opening OP4, a volume of each protruding portion 170b of each first conductive post 170 is substantially equal to a volume of each protruding portion 180b of each second conductive post 180.

Figure 1I:
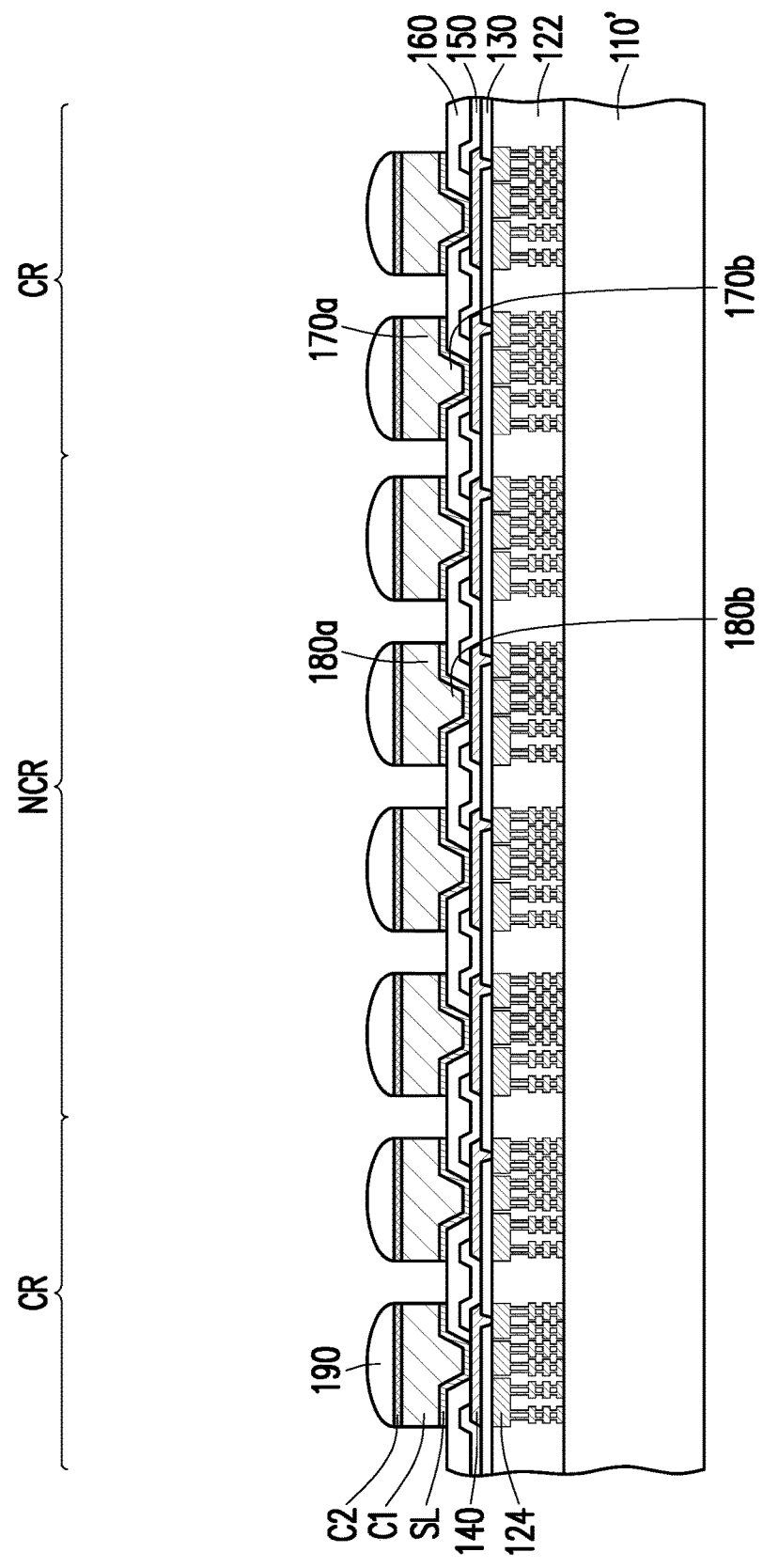

Referring to FIG. 1H and FIG. 1I, a reflow process is performed on the third conductive layer C3 to transform the third conducive layer C3 into conductive terminals 190. That is, the conductive terminals 190 are formed on the first conductive posts 170 and the second conductive posts 180. In some embodiments, the third conductive layer C3 is reshaped during the reflow process to form hemispherical conductive terminals 190.

Figure 1J:
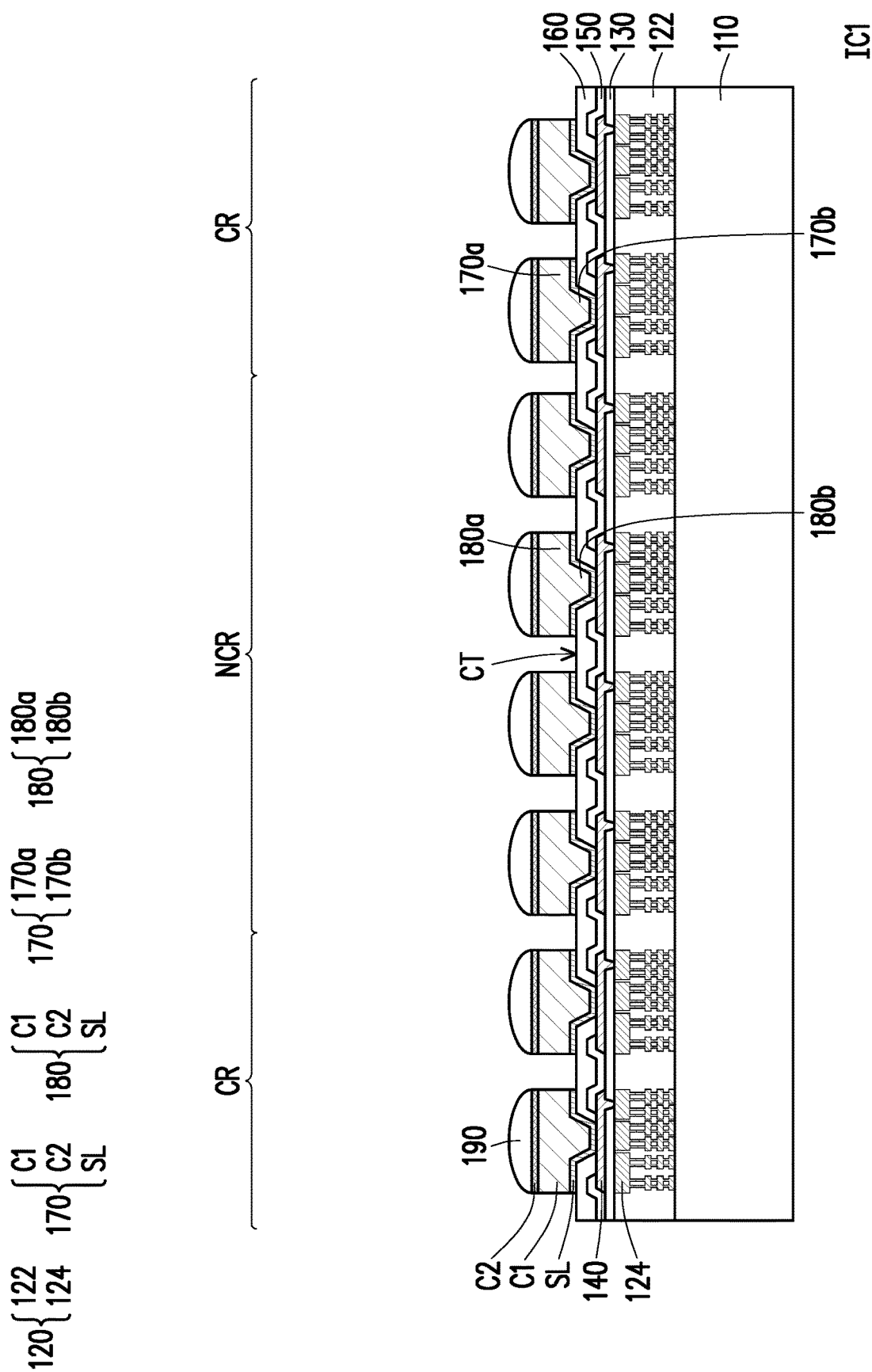

Referring to FIG. 1I and FIG. 1J, the structure illustrated in FIG. 1I may be singulated to render a plurality of integrated circuits IC1 shown in FIG. 1J. In some embodiments, the singulation process typically involves dicing with a rotation blade and/or a laser beam. In other words, the singulation process includes a laser cutting process, a mechanical cutting process, a laser grooving process, other suitable processes, or a combination thereof. For example, a laser grooving process may be performed on the structure illustrated in FIG. 1I to form a trench (not shown) in the said structure. Thereafter, a mechanical cutting process may be performed on the location of the trench to cut through the said structure, so as to divide the semiconductor wafer 110' into semiconductor substrates 110 and to obtain the integrated circuits IC1.

Figure 7A:
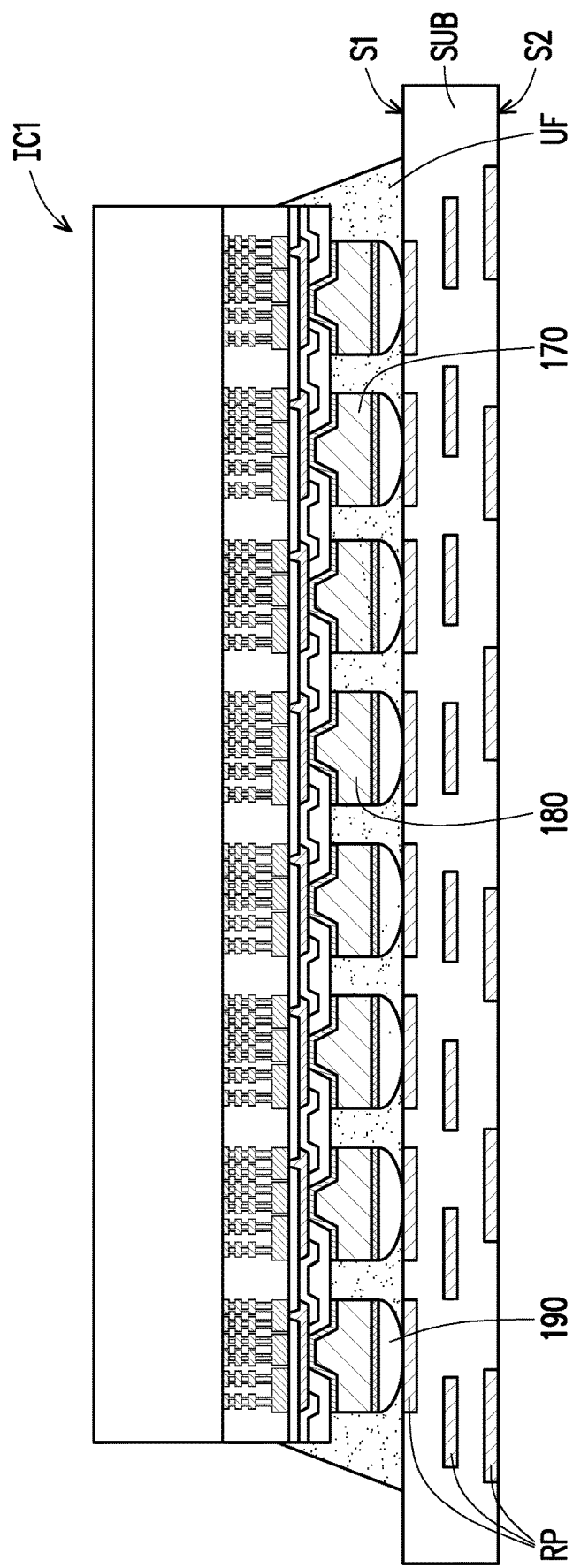
FIG. 7A to FIG. 7C are schematic cross-sectional views illustrating a manufacturing process of a semiconductor package in accordance with some embodiments of the disclosure.

In some embodiments, during the subsequent thermal processes (for example, a thermal reliability test or a bonding process shown in FIG. 7A), delamination between the seed layer SL and the post-passivation layer 160 and between the seed layer SL and the conductive pads 140 would occur due to stress generated from the thermal processes. Such phenomenon is especially severe at the corners of the integrated circuits fabricated. However, as shown in FIG. 1D to FIG. 1J, since the openings OP2 and the openings OP3 of the post-passivation layer 160 located in the corner regions CR are shifted toward the center CT of the integrated circuit IC1, the stress concentrated at the corner regions CR may be sufficiently reduced by at least 25%. As such, the delamination between the seed layer SL and the post-passivation layer 160 and between the seed layer SL and the conductive pads 140 may be sufficiently alleviated, thereby enhancing the reliability and the performance of the integrated circuit IC1.

Figure 3:
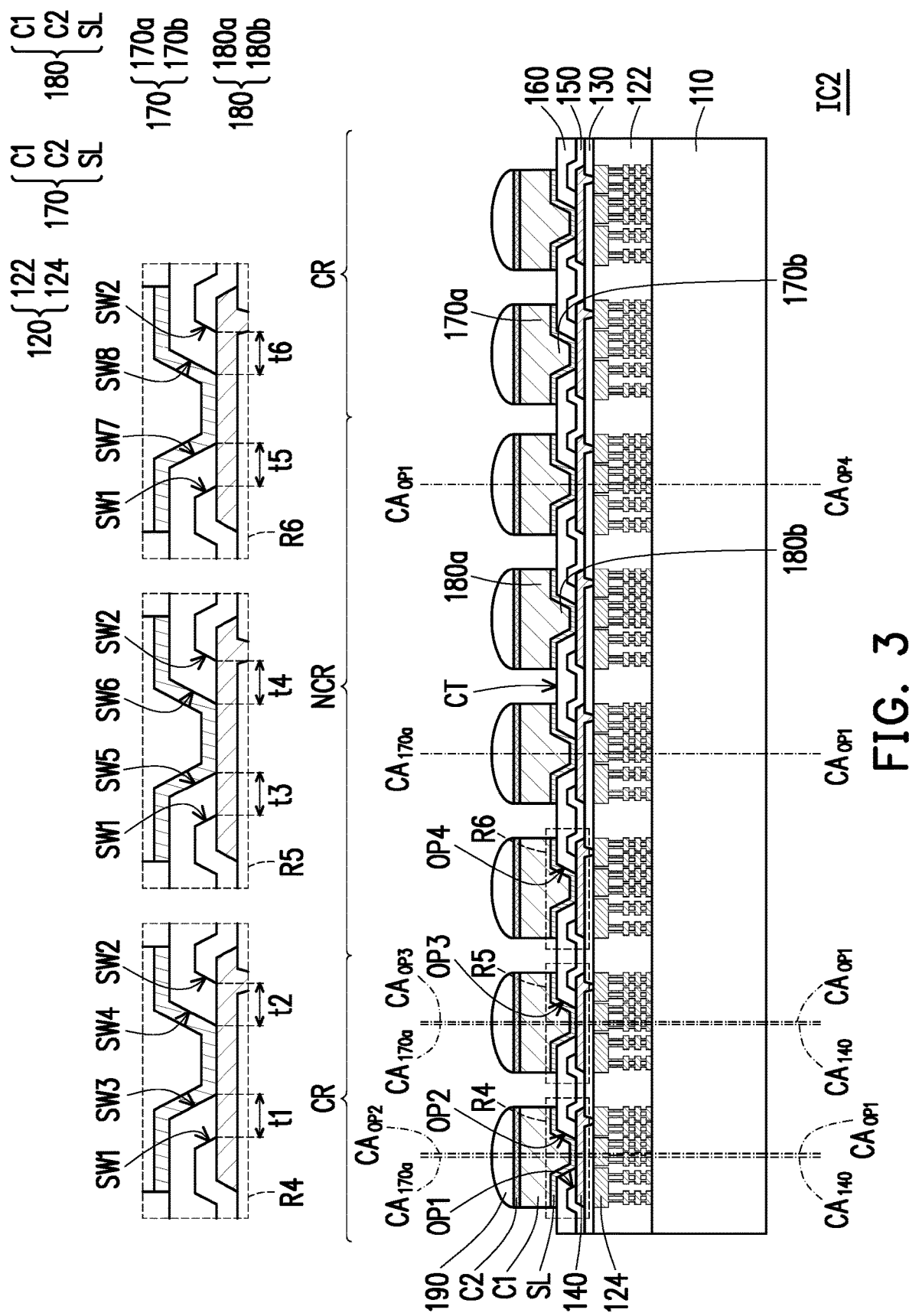
FIG. 3 is a schematic cross-sectional view illustrating an integrated circuit in accordance with some alternative embodiments of the disclosure.

FIG. 3 is a schematic cross-sectional view illustrating an integrated circuit IC2 in accordance with some alternative embodiments of the disclosure. Referring to FIG. 3, the integrated circuit IC2 in FIG. 3 is similar to the integrated circuit IC1 in FIG. 1J, so similar elements are denoted by the same reference numeral and the detailed descriptions thereof are omitted herein. However, in the integrated circuit IC2 of FIG. 3, the locations of some of the openings OP1 of the passivation layer 150 are shifted. For example, the locations of the openings OP1 of the passivation layer 150 located in the corner regions CR are shifted. In some embodiments, the shift of the openings OP1 of the passivation layer 150 is accordance with to the shift of the openings OP2 and the openings OP3 of the post-passivation layer 160.

As illustrated in FIG. 3, a central axis $CA_{OP1}$ of each opening OP1 of the passivation layer 150 is coaxial with a central axis $CA_{OP2}$ of the corresponding opening OP2 of the post-passivation layer 160. That is, the central axes $CA_{OP2}$ of the openings OP2 of the passivation layer 150 are aligned with the central axes $CA_{OP1}$ of the openings OP1 of the post-passivation layer 160. Similarly, a central axis $CA_{OP1}$ of each opening OP1 of the passivation layer 150 is coaxial with a central axis $CA_{OP3}$ of the corresponding opening OP3 of the post-passivation layer 160. That is, the central axes $CA_{OP3}$ of the openings OP3 of the passivation layer 150 are aligned with the central axes $CA_{OP1}$ of the openings OP1 of the post-passivation layer 160. Moreover, a central axis $CA_{OP1}$ of each opening OP1 of the passivation layer 150 is coaxial with a central axis $CA_{OP4}$ of the corresponding opening OP4 of the post-passivation layer 160. That is, the central axes $CA_{OP4}$ of the openings OP4 of the passivation layer 150 are aligned with the central axes $CA_{OP1}$ of the openings OP1 of the post-passivation layer 160.

As illustrated in FIG. 3, a central axis $CA_{170a}$ of the body portion 170a of the first conductive post 170 is coaxial with the central axis $CA_{140}$ of the corresponding conductive pads 140. That is, the central axis $CA_{170a}$ of the body portion 170a of the first conductive post 170 is aligned with the central axis $CA_{140}$ of the corresponding conductive pads 140. As mentioned above, the openings OP2 and the openings OP3 of the post-passivation layer 160 are shifted. Moreover, the openings OP1 of the passivation layer 150 located in the corner regions CR are also shifts. As such, the central axis $CA_{170a}$ of the body portion 170a of the first conductive post 170 has an offset from the central axis $CA_{OP1}$ of the corresponding opening OP1 of the passivation layer 150 located in the corner regions CR along the diagonal direction DRD. Similarly, the central axis $CA_{170a}$ of the body portion 170a of the first conductive post 170 has an offset from the central axis $CA_{OP2}$ of the corresponding opening OP2 of the post-passivation layer 160 along the diagonal direction DRD. Moreover, the central axis $CA_{170a}$ of the body portion 170a of the first conductive post 170 has an offset from the central axis $CA_{OP3}$ of the corresponding opening OP3 of the post-passivation layer 160 along the diagonal direction DRD. In some embodiments, the offset of the openings OP1 in the corner regions CR is substantially equal to the offsets of the openings OP2 and the openings OP3. For example, the offset of the openings OP1 ranges from about 1 μm to about 8 μm along the diagonal direction DRD.

In some embodiments, since the central axes $CA_{OP1}$ of the openings OP1 of the passivation layer 150 are coaxial with the central axes $CA_{OP2}$ of the corresponding opening OP2 of the post-passivation layer 160, the central axes $CA_{OP3}$ of the corresponding opening OP3 of the post-passivation layer 160, and central axes $CA_{OP4}$ of the corresponding opening OP4 of the post-passivation layer 160, a thickness of the post-passivation layer 160 is uniform. The uniformity of the thickness of the post-passivation layer 160 will be described below in conjunction with the enlarged views of regions R4, R5, and R6 in FIG. 3.

Referring to FIG. 3, as illustrated in the enlarged views of regions R4, R5, and R6, each opening OP1 of the passivation layer 150 has a first sidewall SW1 and a second sidewall SW2 opposite to the first sidewall SW1. Meanwhile, each opening OP2 of the post-passivation layer 160 has a third sidewall SW3 and a fourth sidewall SW4 opposite to the third sidewall SW3. In some embodiments, a first distance between the first sidewall SW1 and the third sidewall SW3 corresponds to a first thickness t1 of the post-passivation layer 160. Meanwhile, a second distance between the second sidewall SW2 and the fourth sidewall SW4 corresponds to a second thickness t2 of the post-passivation layer 160. As illustrated in FIG. 3, the first thickness t1 is substantially equal to the second thickness t2. Similarly, each opening OP3 of the post-passivation layer 160 has a fifth sidewall SW5 and a sixth sidewall SW6 opposite to the fifth sidewall SW5. In some embodiments, a third distance between the first sidewall SW1 and the fifth sidewall SW5 corresponds to a third thickness t3 of the post-passivation layer 160. Meanwhile, a fourth distance between the second sidewall SW2 and the sixth sidewall SW6 corresponds to a fourth thickness t4 of the post-passivation layer 160. As illustrated in FIG. 3, the third thickness t3 is substantially equal to the fourth thickness t4. Moreover, each opening OP4 of the post-passivation layer 160 has a seventh sidewall SW7 and an eighth sidewall SW8 opposite to the seventh sidewall SW7. In some embodiments, a fifth distance between the first sidewall SW1 and the seventh sidewall SW7 corresponds to a fifth thickness t5 of the post-passivation layer 160. Meanwhile, a sixth distance between the second sidewall SW2 and the eighth sidewall SW8 corresponds to a sixth thickness t6 of the post-passivation layer 160. As illustrated in FIG. 3, the fifth thickness t5 is substantially equal to the sixth thickness t6. In other words, the thickness (i.e. the first thickness t1 and the second thickness t2) of the post-passivation layer 160 located within the openings OP1 and around the openings OP2, the thickness (i.e. the third thickness t3 and the fourth thickness t4) of the post-passivation layer 160 located within the openings OP1 and around the openings OP3, and the thickness (i.e. the fifth thickness t5 and the sixth thickness t6) of the post-passivation layer 160 located within the openings OP1 and around the openings OP4 are uniform. For example, the first thickness t1, the second thickness t2, the third thickness t3, the fourth thickness t4, the fifth thickness t5, and the sixth thickness t6 are substantially the same. For example, the first thickness t1, the second thickness t2, the third thickness t3, the fourth thickness t4, the fifth thickness t5, and the sixth thickness t6 ranges from about 6 μm to about 14 μm.

In some embodiments, during the subsequent thermal processes (for example, a thermal reliability test or a bonding process shown in FIG. 7A), delamination between the seed layer SL and the post-passivation layer 160 and between the seed layer SL and the conductive pads 140 would occur due to stress generated from the thermal processes. Such phenomenon is especially severe at the corners of the integrated circuits fabricated. However, as shown in FIG. 3, since the openings OP2 and the openings OP3 of the post-passivation layer 160 and the openings OP4 of the passivation layer 150 located in the corner regions CR are shifted toward the center CT of the integrated circuit IC2, the stress concentrated at the corner regions CR may be sufficiently reduced by at least 25%. As such, the delamination between the seed layer SL and the post-passivation layer 160 and between the seed layer SL and the conductive pads 140 may be sufficiently alleviated, thereby enhancing the reliability and the performance of the integrated circuit IC2.

Figure 4:
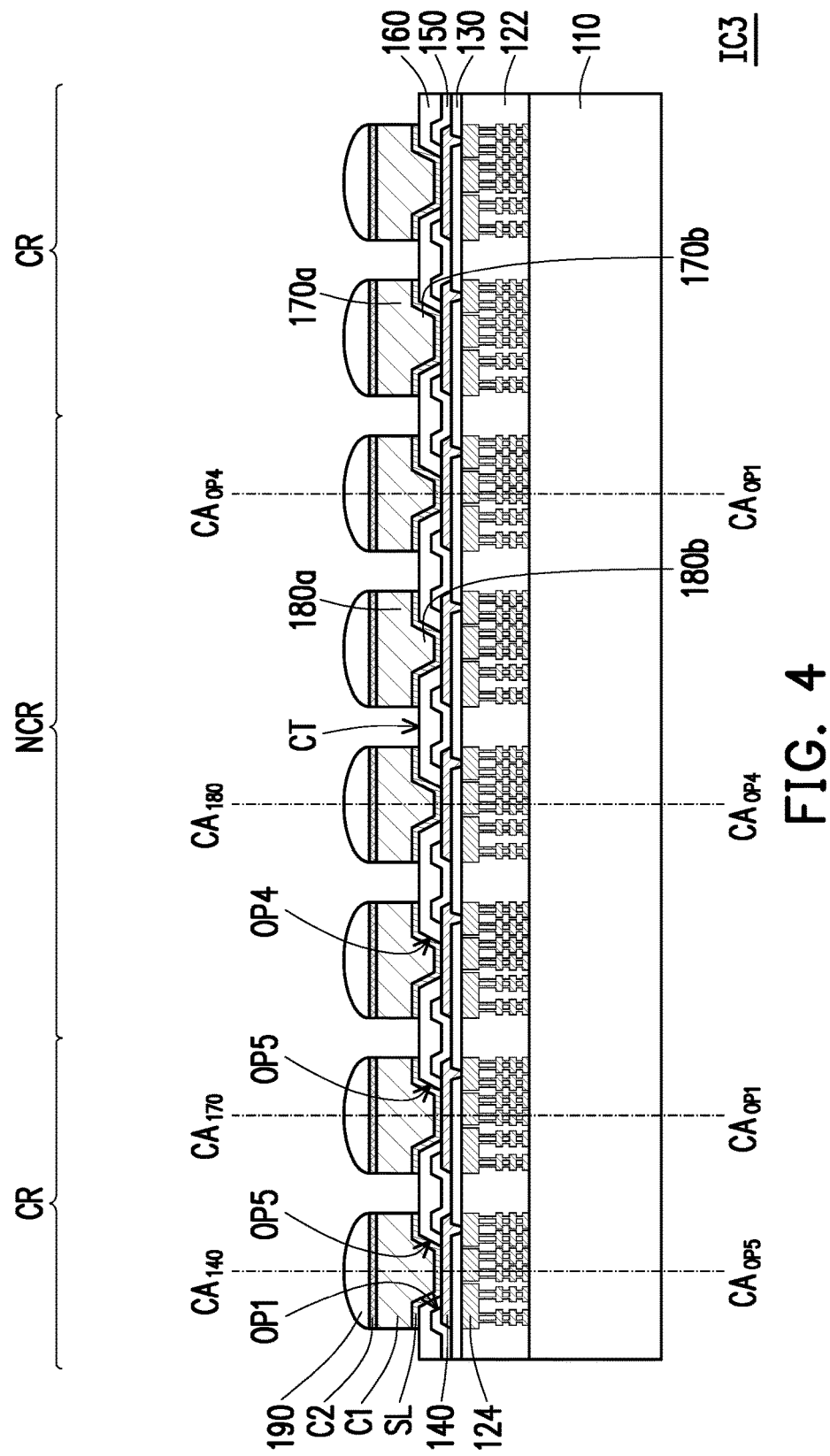
FIG. 4 is a schematic cross-sectional view illustrating an integrated circuit in accordance with some alternative embodiments of the disclosure.
Figure 5:
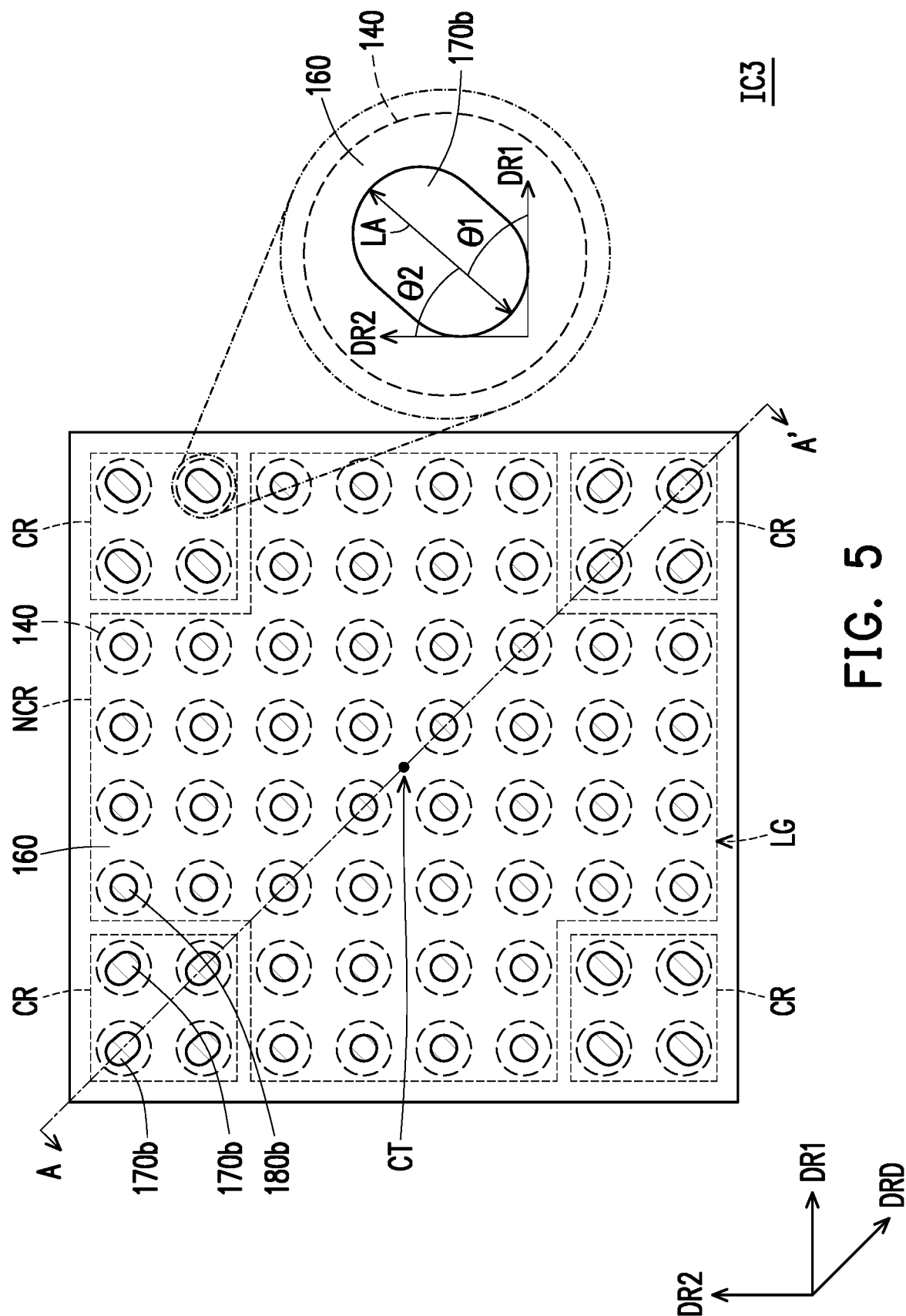
FIG. 5 is a schematic top view of the integrated circuit in FIG. 4.

FIG. 4 is a schematic cross-sectional view illustrating an integrated circuit IC3 in accordance with some alternative embodiments of the disclosure. FIG. 5 is a schematic top view of the integrated circuit IC3 in FIG. 4. Referring to FIG. 4 and FIG. 5, the integrated circuit IC3 in FIG. 4 and FIG. 5 is similar to the integrated circuit IC1 in FIG. 1J, so similar elements are denoted by the same reference numeral and the detailed descriptions thereof are omitted herein. However, in the integrated circuit IC3 of FIG. 4 and FIG. 5, the post-passivation layer 160 has a plurality of openings OP5 in the corner regions CR instead of the openings OP2 and the opening OP3 in FIG. 1J. For simplicity, some elements (i.e. the conductive terminals 190, the second conductive layer C2, the body portion 170a of the first conductive posts 170, and the body portion 180a of the second conductive posts 180) are omitted in the top view of FIG. 5. Moreover, it should be noted that the cross-sectional view of FIG. 4 is taken along line A-A' extending along a diagonal direction DRD of the integrated circuit IC3 in FIG. 5.

As illustrated in FIG. 4, the openings OP5 are not shifted. In other words, in the corner regions CR, a central axis $CA_{140}$ of the conductive pad 140, a central axis $CA_{170}$ of the corresponding first conductive post 170, a central axis $CA_{OP1}$ of the corresponding opening OP1 of the passivation layer 150, and a central axis $CA_{OP5}$ of the corresponding opening OP5 of the post-passivation layer 160 are coaxial. Similarly, in the non-corner region NRC, a central axis $CA_{140}$ of the conductive pad 140, a central axis $CA_{180}$ of the corresponding second conductive post 180, a central axis $CA_{OP1}$ of the corresponding opening OP1 of the passivation layer 150, and a central axis $CA_{OP4}$ of the corresponding opening OP4 of the post-passivation layer 160 are coaxial.

In some embodiments, the openings OP5 are oval-shaped from the top view. Since the protruding portions 170b completely fill up the openings OP5, a shape of the protruding portions 170b is identical to a shape of the openings OP5. For example, the protruding portion 170b and the openings OP5 are oval-shaped from the top view, as illustrated in FIG. 5. In some embodiments, the openings OP4 are circular-shaped from the top view. Since the protruding portions 180b completely fill up the openings OP4, a shape of the protruding portions 180b is identical to a shape of the openings OP4. For example, the protruding portion 180b and the openings OP4 are circular-shaped from the top view, as illustrated in FIG. 5. That is, the shape of the protruding portions 170b of the first conductive posts 170 located in the corner regions CR are different from the shape of the protruding portions 180b of the second conductive posts 180 located in the non-corner region CR. In some embodiments, each opening OP5 is greater than each opening OP4. That is, a volume of each protruding portion 170b of each first conductive post 170 is greater than a volume of each protruding portion 180b of each second conductive post 180.

As illustrated in FIG. 5, the protruding portions 170b of the first conducive posts 170 are rotated. In some embodiments, two opposite sides of the integrated circuit IC3 are arranged along a first direction DR1 and another two opposite sides of the integrated circuit are arranged along a second direction DR2 perpendicular to the first direction DR1. Meanwhile, the diagonal direction DRD forms an included angle of 45° with both the first direction DR1 and the second direction DR2. As illustrated in FIG. 5, each protruding portion 170b of the first conductive post 170 has a long axis LA from the top view. The long-axis LA forms an included angle θ1 of greater than 0° and less than 90° with the first direction DR1. Similarly, the long-axis LA also forms an included angle θ2 of greater than 0° and less than 90° with the second direction DR2. As illustrated in FIG. 5, the long-axes LA extend along diagonal direction of the integrated circuit IC3 (i.e. forms an included angle θ1 of 45° with the first direction DR1 and forms an included angle θ2 of 45° with the second direction DR2). However, it should be understood that the configuration shown in FIG. 5 is merely an exemplary illustration. In some alternative embodiments, the included angles θ1 and θ2 may be other values as long as the value falls within the foregoing range. As illustrated in FIG. 5, the corner regions CR are arranged in mirror symmetry with respect to the center CT of the integrated circuit IC3. Similarly, the protruding portions 170b of the first conductive posts 170 and the protruding portions 180b of the second conductive posts 180 are also arranged in mirror symmetry.

In some embodiments, during the subsequent thermal processes (for example, a thermal reliability test or a bonding process shown in FIG. 7A), delamination between the seed layer SL and the post-passivation layer 160 and between the seed layer SL and the conductive pads 140 would occur due to stress generated from the thermal processes. Such phenomenon is especially severe at the corners of the integrated circuits fabricated. However, as shown in FIG. 4 and FIG. 5, the openings OP5 and the protruding portions 170b of the first conducive posts 170 located in the corner regions CR are oval-shaped and are rotated. In some embodiments, the long axis LA corresponds to a direction in which the stress accumulates. As such, by rotating the oval-shaped openings OP5 and the oval-shaped protruding portions 170b of the first conducive posts 170 located in the corner regions CR, stress concentrated at the corner regions CR may be sufficiently reduced by at least 25%. As such, the delamination between the seed layer SL and the post-passivation layer 160 and between the seed layer SL and the conductive pads 140 may be sufficiently alleviated, thereby enhancing the reliability and the performance of the integrated circuit IC3.

Figure 6:
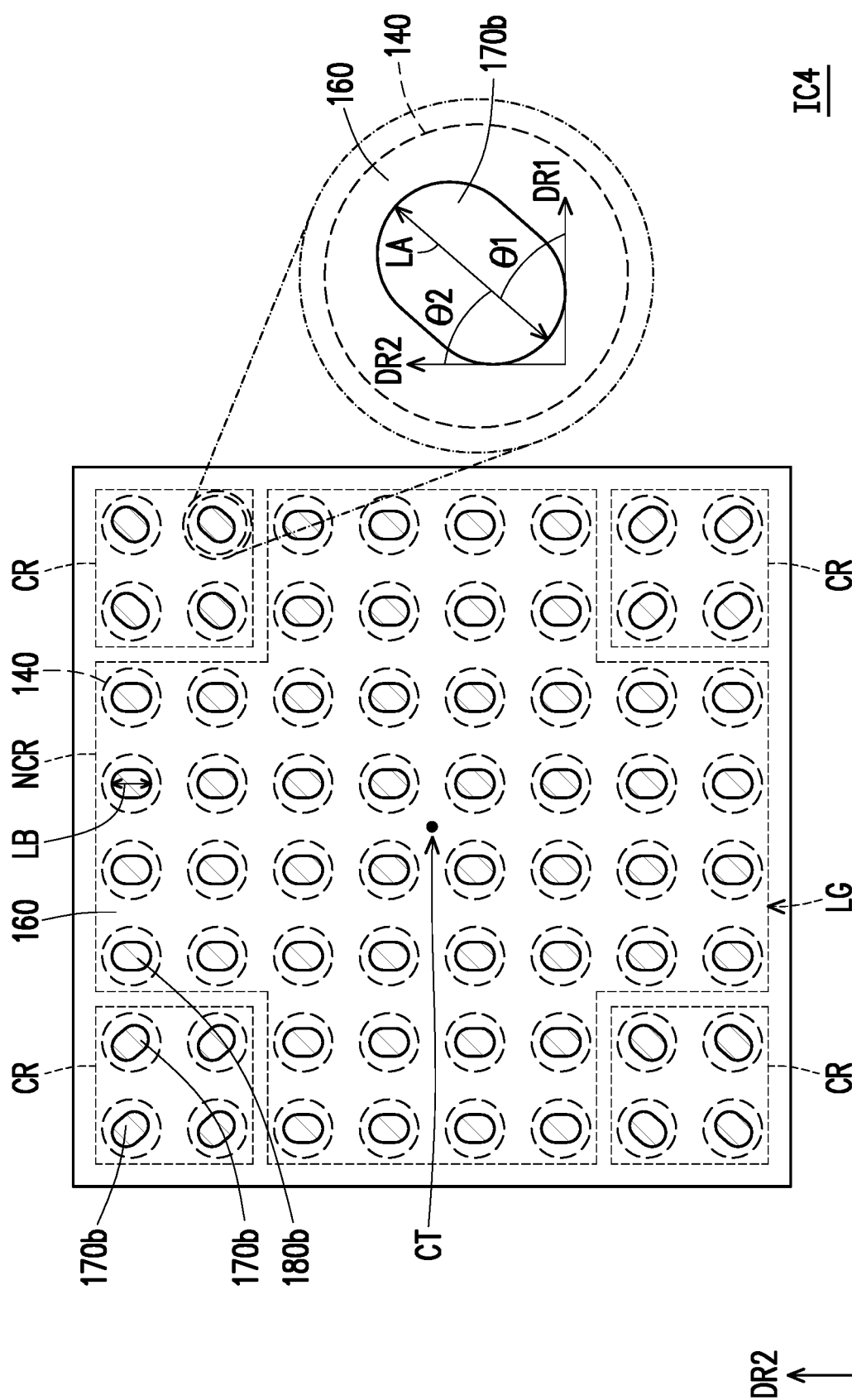
FIG. 6 is a schematic top view of an integrated circuit in accordance with some alternative embodiments of the disclosure.

FIG. 6 is a schematic top view of an integrated circuit IC4 in accordance with some alternative embodiments of the disclosure. Referring to FIG. 6, the integrated circuit IC4 in FIG. 6 is similar to the integrated circuit IC3 in FIG. 4 and FIG. 5, so similar elements are denoted by the same reference numeral and the detailed descriptions thereof are omitted herein. However, in the integrated circuit IC4 of FIG. 6, the openings OP4 and the protruding portions 180b of the second conductive posts 180 are oval-shaped from a top view. As illustrated in FIG. 6, an orientation of the protruding portions 170b of the first conductive posts 170 is different from an orientation of the protruding portions 180b of the second conductive posts 180. For example, the protruding portions 170b of the first conducive posts 170 are rotated. On the other hand, the protruding portions 180b of the second conductive posts 180 are not rotated. In some embodiments, two opposite sides of the integrated circuit IC4 are arranged along a first direction DR1 and another two opposite sides of the integrated circuit are arranged along a second direction DR2 perpendicular to the first direction DR1. As illustrated in FIG. 6, each protruding portion 170b of the first conductive post 170 has a long axis LA from the top view. The long-axis LA forms an included angle θ1 of greater than 0° and less than 90° with the first direction DR1. Similarly, the long-axis LA also forms an included angle θ2 of greater than 0° and less than 90° with the second direction DR2. On the other hand, each protruding portion 180b of the second conductive post 180 has a long axis LB from the top view. The long-axis LB is parallel to the second direction DR2 and is perpendicular to the first direction DR1.

In some embodiments, a volume of each protruding portion 170b of each first conductive post 170 is substantially equal to a volume of each protruding portion 180b of each second conductive post 180.

In some embodiments, during the subsequent thermal processes (for example, a thermal reliability test or a bonding process shown in FIG. 7A), delamination between the seed layer SL and the post-passivation layer 160 and between the seed layer SL and the conductive pads 140 would occur due to stress generated from the thermal processes. Such phenomenon is especially severe at the corners of the integrated circuits fabricated. However, as shown in FIG. 6, the protruding portions 170b of the first conducive posts 170 located in the corner regions CR are oval-shaped and are rotated. In some embodiments, the long axis LA corresponds to a direction in which the stress accumulates. As such, by rotating the oval-shaped protruding portions 170b of the first conducive posts 170 located in the corner regions CR, stress concentrated at the corner regions CR may be sufficiently reduced by at least 25%. As such, the delamination between the seed layer SL and the post-passivation layer 160 and between the seed layer SL and the conductive pads 140 may be sufficiently alleviated, thereby enhancing the reliability and the performance of the integrated circuit IC4.

In some embodiments, the corner regions CR denote regions including 12 bumps. That is, each corner region CR may include 12 conductive posts 170. Since the stress is most severe at the regions occupied by the corner 12 bumps, altering the configuration of the bumps in the regions defined by these 12 bumps may sufficiently reduce the stress concentrated at the corners of the integrated circuit. For simplicity, in FIG. 2, FIG. 5, and FIG. 6, 4 first conductive posts 170 are illustrated in each corner region CR. However, it should be understood that each corner region CR may include more or less first conductive posts 170.

In some embodiments, the integrated circuit IC1 in FIG. 1J, the integrated circuit IC2 in FIG. 3, the integrated circuit IC3 in FIG. 4 and FIG. 5, and the integrated circuit IC4 in FIG. 6 can be used in various package structures. For example, the integrated circuits IC1 to IC4 may be used in a flip-chip ball grid array (FCBGA) package, flip-chip chip scale package (FCCSP), integrated fan-out (InFO) package, chip on wafer on substrate (CoWoS) package, or other suitable packages. The utilization of the integrated circuit IC1 in a FCCSP will be described below in conjunction with FIG. 7A to FIG. 7C. It should be understood that the application shown in FIG. 7A to FIG. 7C merely serves as an exemplary application, and the disclosure is not limited thereto.

Figure 7B:
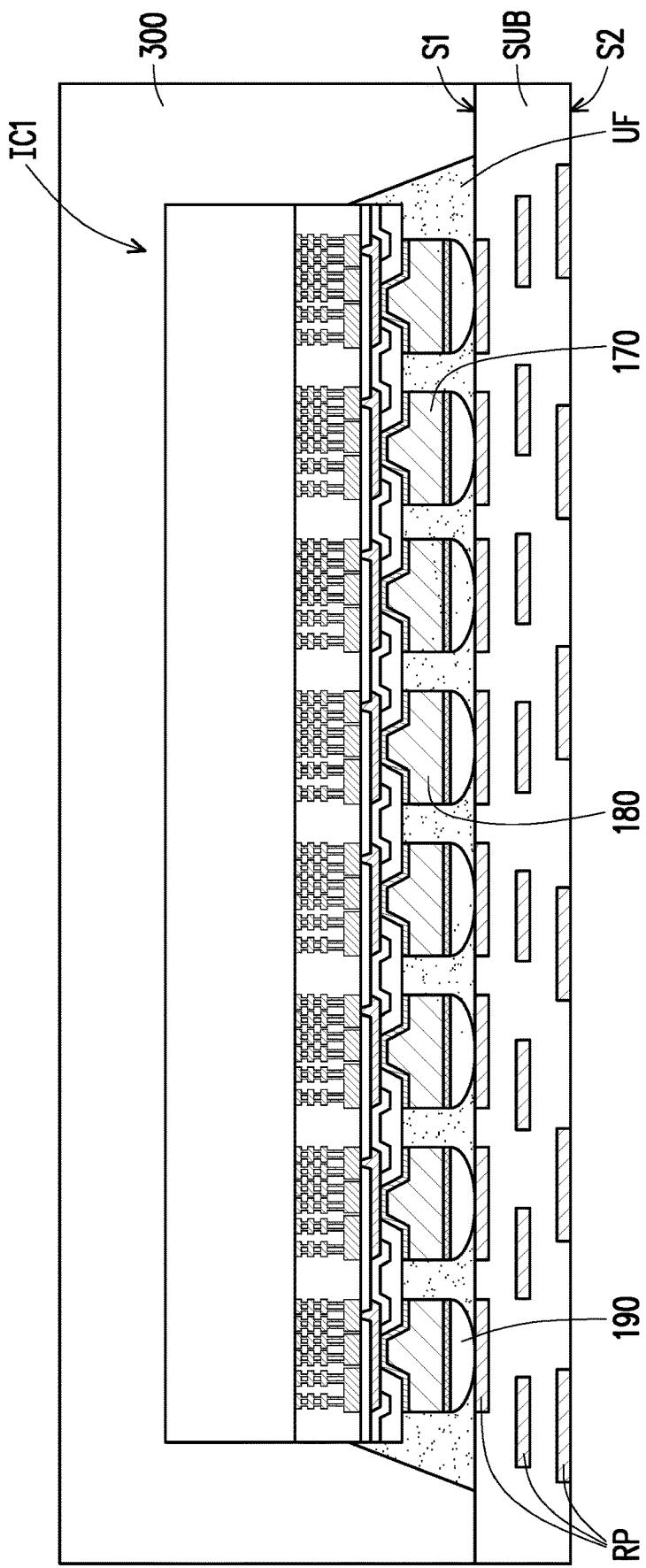
Figure 7C:
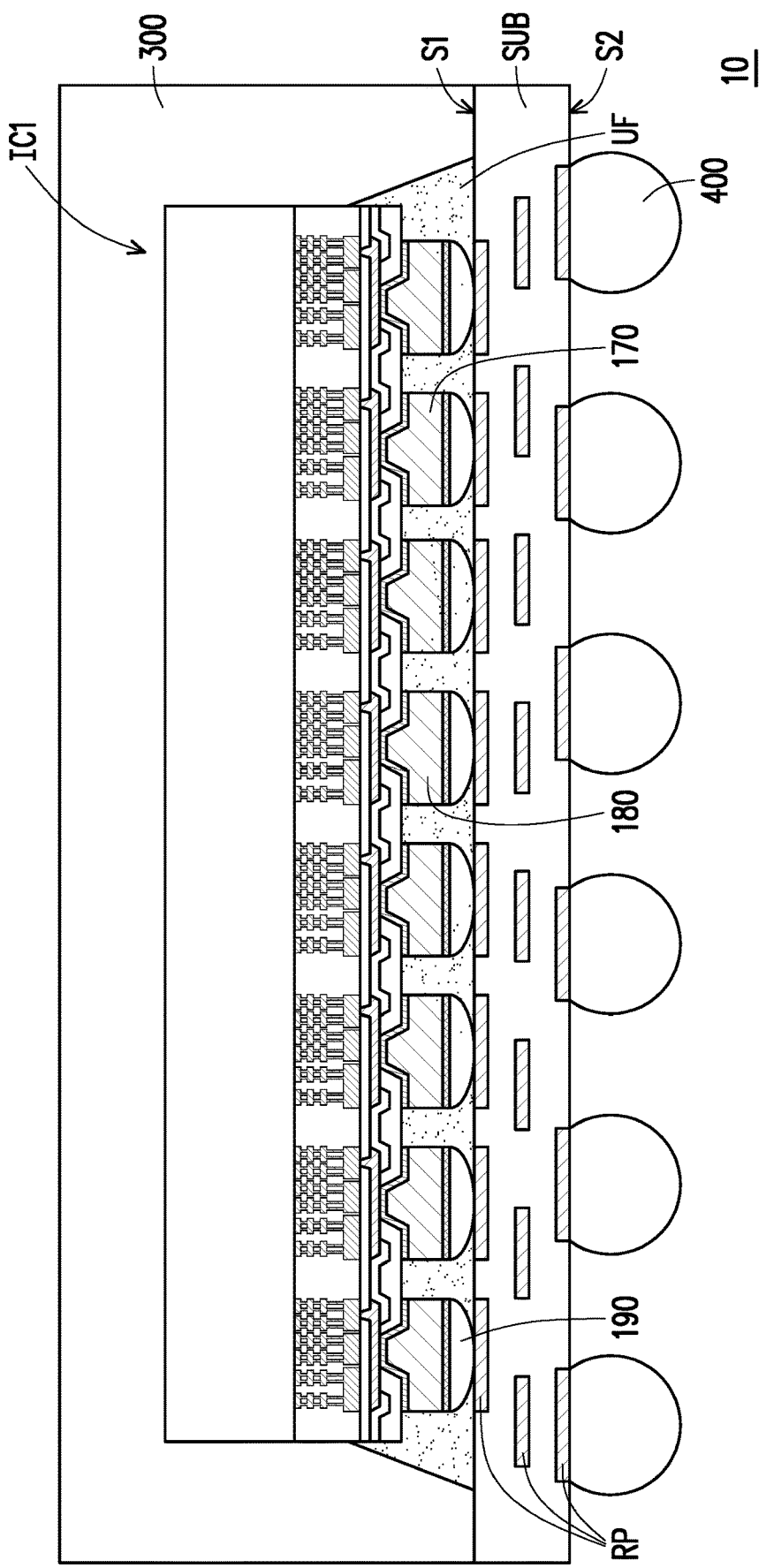

FIG. 7A to FIG. 7C are schematic cross-sectional views illustrating a manufacturing process of a semiconductor package 10 in accordance with some embodiments of the disclosure. Referring to FIG. 7A, a circuit substrate SUB is provided. In some embodiments, the circuit substrate SUB is a printed circuit board (PCB) or the like. In some embodiments, the circuit substrate SUB includes a plurality of routing patterns RP embedded therein. In some embodiments, the routing patterns RP are interconnected with one another. That is, the routing patterns RP are electrically connected to one another. As illustrated in FIG. 7A, the circuit substrate SUB has a first surface 51 and a second surface S2 opposite to the first surface 51. In some embodiments, some of the routing patterns RP are exposed at the first surface 51 and some of the routing patterns RP are exposed at the second surface S2.

As illustrated in FIG. 7A, the integrated circuit IC1 in FIG. 1J is bonded to the first surface 51 of the circuit substrate SUB. In some embodiments, the integrated circuit IC1 is attached to the circuit substrate SUB through the conductive terminals 190. For example, the conductive terminals 190 of the integrated circuit IC1 are in physical contact with the routing patterns RP exposed at the first surface 51 of the circuit substrate SUB to render electrical connection between the integrated circuit IC1 and the circuit substrate SUB. It should be noted that although the integrated circuit IC1 is attached to the circuit substrate SUB in FIG. 7A, the disclosure is not limited thereto. In some alternative embodiments, the integrated circuit IC2 in FIG. 3, the integrated circuit IC3 in FIG. 4 and FIG. 5, and the integrated circuit IC4 in FIG. 6 may be used in place of the integrated circuit IC1.

In some embodiments, an underfill layer UF is formed between the integrated circuit IC1 and the first surface 51 of the circuit substrate SUB. For example, the underfill layer UF wraps around the first conductive posts 170, the second conductive posts 180, and the conductive terminals 190 of the integrated circuit IC1. In some embodiments, the underfill layer UF is utilized to protect these elements. In some embodiments, the underfill layer UF further covers portions of each sidewall of the integrated circuit IC1. In some embodiments, a material of the underfill layer UF is an insulating material and may include a resin (e.g., epoxy resin), a filler material, a stress release agent (SRA), an adhesion promoter, other material, or a combination thereof. In some embodiments, the underfill layer UF is optional.

Referring to FIG. 7B, an encapsulant 300 is formed over the circuit substrate SUB. In some embodiments, the encapsulant 300 encapsulates the integrated circuit IC1 and the underfill layer UF. In some embodiments, the encapsulant 300 completely covers the integrated circuit IC1 and the underfill layer UF. In some embodiments, the encapsulant 300 is a molding compound, a molding underfill, a resin (such as epoxy), or the like. In some embodiments, the encapsulant 300 includes fillers. The fillers may be particles made of silica, aluminum dioxide, or the like. In some embodiments, the encapsulant 300 is formed by a molding process, an injection process, a combination thereof, or the like. The molding process includes, for example, a transfer molding process, a compression molding process, or the like.

Referring to FIG. 7C, a plurality of conductive terminals 400 are formed on the second surface S2 of the circuit substrate SUB to obtain the semiconductor package 10. In some embodiments, the conductive terminals 400 are solder balls, ball grid array (BGA) balls, or the like. In some embodiments, the conductive terminals 400 are made of a conductive material with low resistivity, such as Sn, Pb, Ag, Cu, Ni, Bi, or an alloy thereof. In some embodiments, the conductive terminals 400 of the integrated circuit IC1 are in physical contact with the routing patterns RP exposed at the second surface S2 of the circuit substrate SUB.

In accordance with some embodiments of the disclosure, an integrated circuit has corner regions and a non-corner region between the corner regions and includes a semiconductor substrate, conductive pads, passivation layer, post-passivation layer, first conductive posts, and second conductive posts. The conductive pads are disposed over the semiconductor substrate. The passivation layer and the post-passivation layer are sequentially disposed over the conductive pads. The first conductive posts and the second conductive posts are disposed on the post-passivation layer and are electrically connected to the conductive pads. The first conductive posts are disposed in the corner regions and the second conductive posts are disposed in the non-corner regions. Each of the first conductive posts has a body portion and a protruding portion connected to the body portion. A central axis of the body portion of the first conductive post has an offset from a central axis of the protruding portion of the first conductive post.

In accordance with some embodiments of the disclosure, a semiconductor package includes a circuit substrate, an integrated circuit, and an encapsulant. The integrated circuit is disposed on the circuit substrate. The integrated circuit has corner regions and a non-corner region between the corner regions. The integrated circuit includes a semiconductor substrate, conductive pads, passivation layer, post-passivation layer, first conductive posts, and second conductive posts. The conductive pads are disposed over the semiconductor substrate. The passivation layer and the post-passivation layer are sequentially disposed over the conductive pads. The first conductive posts and the second conductive posts are disposed on the post-passivation layer and are electrically connected to the conductive pads. The first conductive posts are disposed in the corner regions and the second conductive posts are disposed in the non-corner regions. Each of the first conductive posts has a body portion and a protruding portion connected to the body portion. The protruding portion of the first conductive post is oval-shaped from a top view. The encapsulant is over the circuit substrate and encapsulates the integrated circuit.

In accordance with some embodiments of the disclosure, a manufacturing method of a semiconductor package includes at least the following steps. An integrated circuit having corner regions and a non-corner region between the corner regions is formed. The integrated circuit is formed by at least the following steps. A semiconductor wafer is provided. Conductive pads are formed over the semiconductor wafer. A passivation layer is formed over the conductive pads. The passivation layer has first openings partially expose each conductive pad. A post-passivation layer is formed on the passivation layer and within the first openings. The post-passivation layer has second openings located in the corner regions and third openings located in the non-corner regions. The second openings and the third openings partially expose the conductive pads. A central axis of each conductive pad has an offset from a central axis of the corresponding second opening. The central axis of each conductive pad is coaxial with a central axis of the corresponding third opening. Conductive posts are formed on the post-passivation layer to fill up the second openings and the third openings. Conductive terminals are formed on the conductive posts. The integrated circuit is bonded to a circuit substrate through the conductive terminals.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit having corner regions and a non-corner region between the corner regions, comprising:
    a semiconductor substrate;
    conductive pads disposed over the semiconductor substrate;
    a passivation layer and a post-passivation layer sequentially disposed over the conductive pads; and
    first conductive posts and second conductive posts disposed on the post-passivation layer and electrically connected to the conductive pads, wherein the first conductive posts are disposed in the corner regions and the second conductive posts are disposed in the non-corner regions, each of the first conductive posts has a body portion and a protruding portion connected to the body portion, a central axis of the body portion of the first conductive post has an offset from a central axis of the protruding portion of the first conductive post, and the central axis of the body portion of the first conductive post is coaxial with a central axis of the corresponding conductive pad.

2. The integrated circuit of claim 1, wherein the protruding portions of the first conductive posts are in physical contact with the conductive pads.

3. The integrated circuit of claim 1, wherein a distance between a first sidewall of the body portion of the first conductive post and a first sidewall of the protruding portion of the first conductive post is D1, a distance between a second sidewall of the body portion of the first conductive post and a second sidewall of the protruding portion of the first conductive post is D2, D1 is greater than D2, and 1<D1/D2<3.

4. The integrated circuit of claim 1, wherein each of the second conductive posts has a body portion and a protruding portion connected to the body portion, and a central axis of the body portion of the second conductive post is coaxial with a central axis of the protruding portion of the second conductive post.

5. The integrated circuit of claim 4, wherein a volume of the protruding portion of the first conductive post is substantially equal to a volume of the protruding portion of the second conductive post.

6. The integrated circuit of claim 4, wherein the central axis of the body portion of the second conductive post is coaxial with the central axis of the corresponding conductive pad.

7. An integrated circuit having corner regions and a non-corner region between the corner regions, comprising:
    a semiconductor substrate;
    conductive pads disposed over the semiconductor substrate;
    a post-passivation layer disposed over the conductive pads; and
    first conductive posts and second conductive posts disposed on the post-passivation layer and electrically connected to the conductive pads, wherein the first conductive posts are disposed in the corner regions and the second conductive posts are disposed in the non-corner regions, each of the first conductive posts has a body portion and a protruding portion connected to the body portion, and a central axis of the protruding portion of one of the first conductive posts has an offset from a central axis of the corresponding conductive pad.

8. The integrated circuit of claim 7, wherein the protruding portions of the first conductive posts are in physical contact with the conductive pads.

9. The integrated circuit of claim 7, wherein a distance between a first sidewall of the body portion of the first conductive post and a first sidewall of the protruding portion of the first conductive post is D1, a distance between a second sidewall of the body portion of the first conductive post and a second sidewall of the protruding portion of the first conductive post is D2, D1 is greater than D2, and 1<D1/D2<3.

10. The integrated circuit of claim 7, wherein each of the second conductive posts has a body portion and a protruding portion connected to the body portion, and a central axis of the body portion of the second conductive post is coaxial with a central axis of the protruding portion of the second conductive post.

11. The integrated circuit of claim 10, wherein a volume of the protruding portion of the first conductive post is substantially equal to a volume of the protruding portion of the second conductive post.

12. The integrated circuit of claim 10, wherein the central axis of the body portion of the second conductive post is coaxial with a central axis of the corresponding conductive pad.

13. A manufacturing method of a semiconductor package, comprising:
   forming an integrated circuit having corner regions and a non-corner region between the corner regions, comprising:
      providing a semiconductor wafer;
      forming conductive pads over the semiconductor wafer;
      forming a passivation layer over the conductive pads, wherein the passivation layer has first openings partially expose each conductive pad;
      forming a post-passivation layer on the passivation layer and within the first openings, wherein the post-passivation layer has second openings located in the corner regions and third openings located in the non-corner regions, and the second openings and the third openings partially expose the conductive pads;
      forming first conductive posts and second conductive posts on the post-passivation layer, wherein the first conductive posts and the second conductive posts are electrically connected to the conductive pads, the first conductive posts are disposed in the corner regions and the second conductive posts are disposed in the non-corner regions, each of the first conductive posts has a body portion and a protruding portion connected to the body portion and filling up the second openings, a central axis of the body portion of the first conductive post has an offset from a central axis of the protruding portion of the first conductive post, and the central axis of the body portion of the first conductive post is coaxial with a central axis of the corresponding conductive pad; and
   forming conductive terminals on the conductive posts; and
   bonding the integrated circuit to a circuit substrate through the conductive terminals.

14. The method of claim 13, wherein a central axis of each first opening has an offset from a central axis of the corresponding second opening along a diagonal direction of the integrated circuit, and the central axis of each first opening is coaxial with a central axis of the corresponding third opening.

15. The method of claim 13, wherein a central axis of each first opening is coaxial with a central axis of the corresponding second opening, and the central axis of each first opening is coaxial with a central axis of the corresponding third opening.

16. The method of claim 13, wherein the third openings are closer to a center of the integrated circuit than the second openings.

17. The method of claim 13, wherein a central axis of each conductive pad has an offset from a central axis of the corresponding second opening, and the central axis of each conductive pad is coaxial with a central axis of the corresponding third opening.

18. The method of claim 13, wherein each first opening has a first sidewall and a second sidewall opposite to the first sidewall, each second opening has a third sidewall and a fourth sidewall opposite to the third sidewall, a first distance between the first sidewall and the third sidewall is greater than a second distance between the second sidewall and the fourth sidewall.

19. The method of claim 18, wherein the post-passivation layer further comprises fourth openings located in the non-corner region, the fourth openings are closer to a center of the integrated circuit than the second openings, each fourth opening has a fifth sidewall and a sixth sidewall opposite to the fifth sidewall, a third distance between the first sidewall and the fifth sidewall is smaller than the first distance, and a fourth distance between the sixth sidewall and the second sidewall is greater than the second distance.

20. The method of claim 19, wherein each third opening has a seventh sidewall and a eighth sidewall opposite to the seventh sidewall, a fifth distance between the first sidewall and the seventh sidewall is substantially equal to a sixth distance between the second sidewall and the eighth sidewall, the fifth distance is smaller than the third distance, and the sixth distance is greater than the fourth distance.

* * * * *